(12) United States Patent
Reinmuth

(10) Patent No.: US 8,671,757 B2
(45) Date of Patent: Mar. 18, 2014

(54) MICROMECHANICAL COMPONENT

(75) Inventor: Jochen Reinmuth, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 320 days.

(21) Appl. No.: 12/872,596

(22) Filed: Aug. 31, 2010

(65) Prior Publication Data

US 2011/0048131 A1    Mar. 3, 2011

(30) Foreign Application Priority Data

Sep. 2, 2009  (DE) .......................... 10 2009 029 095

(51) Int. Cl.
*G01P 15/125*    (2006.01)

(52) U.S. Cl.
USPC ...................................... 73/514.32

(58) Field of Classification Search
USPC ............... 73/514.32, 514.36, 514.38, 514.29, 73/504.12, 504.04
See application file for complete search history.

(56) References Cited

U.S. PATENT DOCUMENTS

| | | | |
|---|---|---|---|
| 6,230,564 B1 * | 5/2001 | Matsunaga et al. ......... | 73/514.01 |
| 6,272,926 B1 * | 8/2001 | Fehrenbach et al. ....... | 73/514.32 |
| 6,360,605 B1 * | 3/2002 | Pinter et al. ................. | 73/514.38 |
| 6,634,232 B1 * | 10/2003 | Rettig et al. ............... | 73/514.15 |
| 6,923,062 B2 * | 8/2005 | Franz et al. ................. | 73/514.38 |
| 7,121,141 B2 * | 10/2006 | McNeil ....................... | 73/514.32 |
| 7,232,701 B2 | 6/2007 | Gogoi et al. | |
| 7,578,190 B2 * | 8/2009 | Lin et al. ..................... | 73/514.29 |
| 7,721,604 B2 * | 5/2010 | Pruetz ......................... | 73/514.32 |
| 8,079,262 B2 * | 12/2011 | Guo ............................. | 73/514.32 |
| 8,186,221 B2 * | 5/2012 | Lin et al. ..................... | 73/514.32 |
| 2004/0025589 A1 | 2/2004 | Kurle et al. | |
| 2009/0031809 A1 * | 2/2009 | Lin et al. ..................... | 73/514.32 |
| 2009/0308159 A1 * | 12/2009 | Frey et al. ................... | 73/514.32 |
| 2010/0050771 A1 * | 3/2010 | Je et al. ....................... | 73/514.32 |

FOREIGN PATENT DOCUMENTS

| | | |
|---|---|---|
| DE | 19817357 | 10/1999 |
| EP | 1307750 | 12/2006 |
| EP | 1947053 | 1/2008 |

\* cited by examiner

*Primary Examiner* — Helen Kwok
(74) *Attorney, Agent, or Firm* — Kenyon & Kenyon LLP

(57) ABSTRACT

A micromechanical component which has a substrate, a seismic mass, which is deflectably situated on the substrate, and a stop structure for limiting a deflection of the seismic mass in a direction away from the substrate. The stop structure is situated on the substrate and has a limiting section for limiting the deflection of the seismic mass, which is in a plane with the seismic mass. Furthermore, a method for manufacturing a micromechanical component is described.

13 Claims, 20 Drawing Sheets

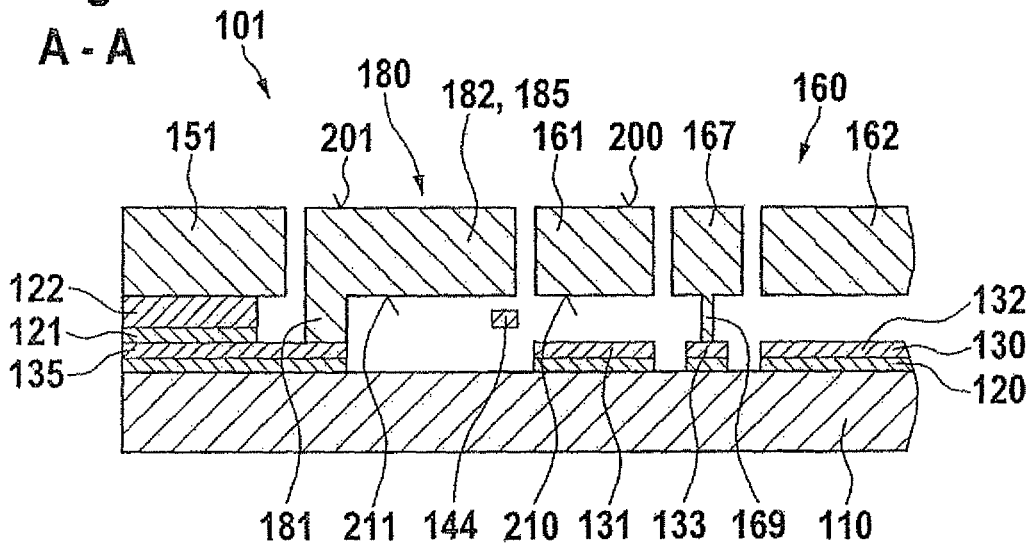
Fig. 26 A-A
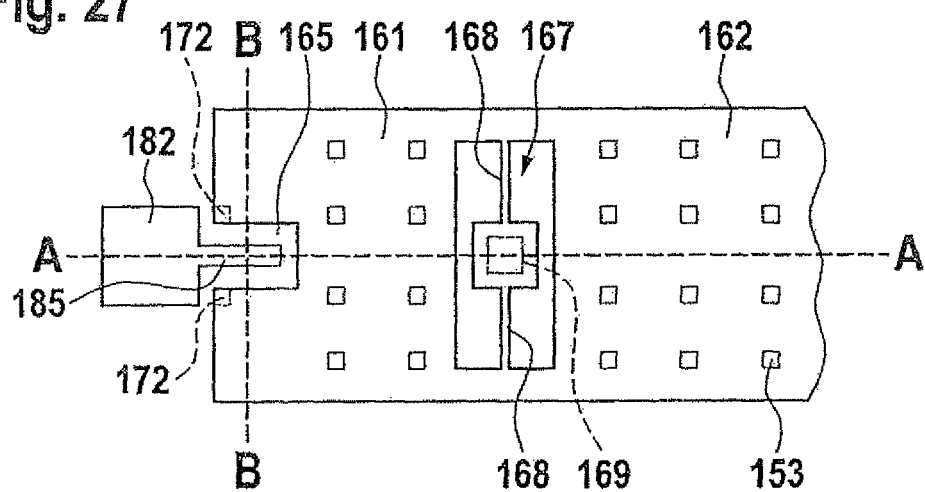
Fig. 27
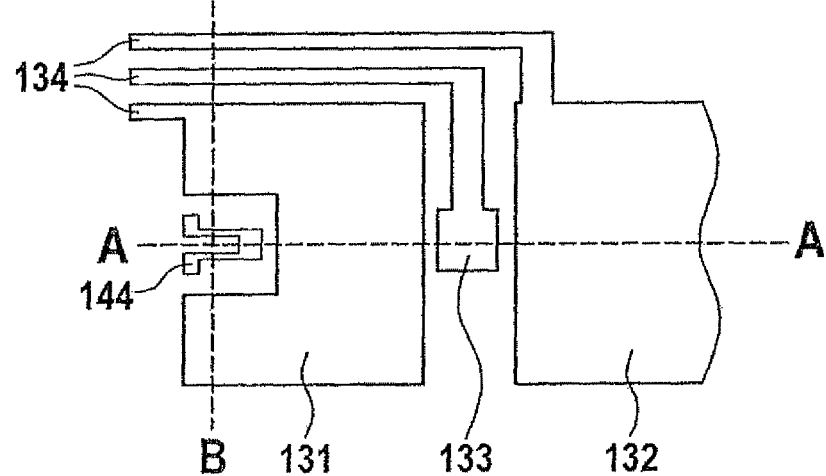
Fig. 28

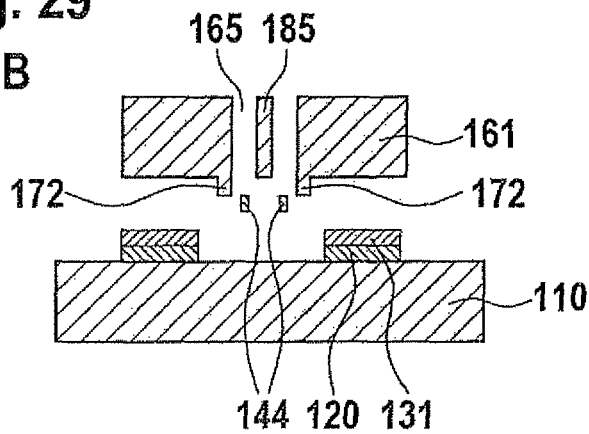
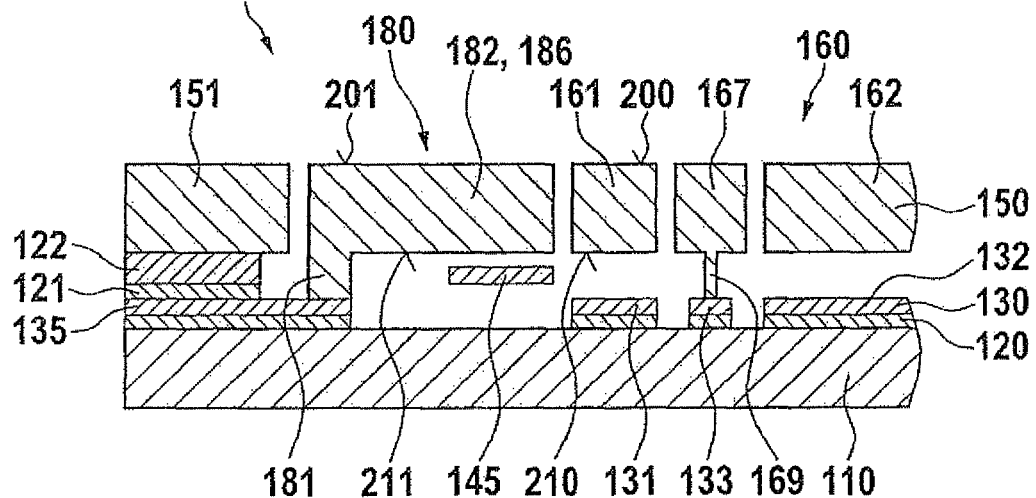
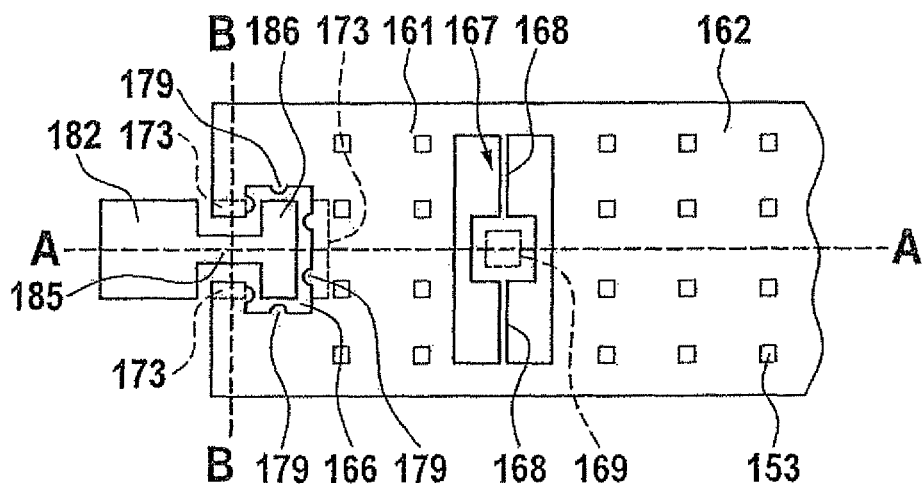

B - B

A - A

B - B

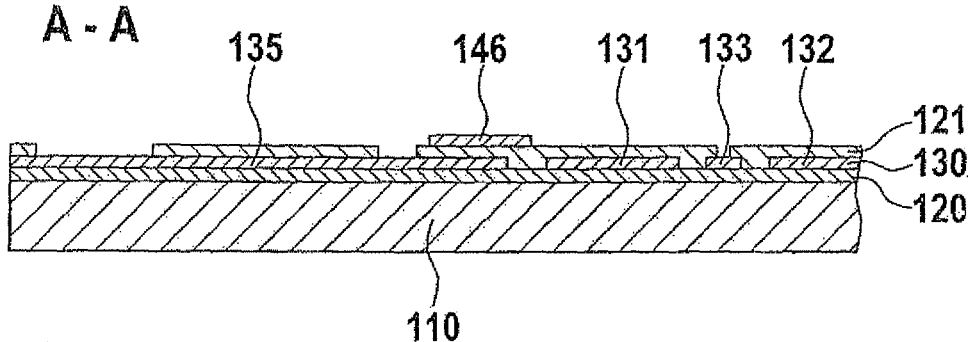
Fig. 37 A-A
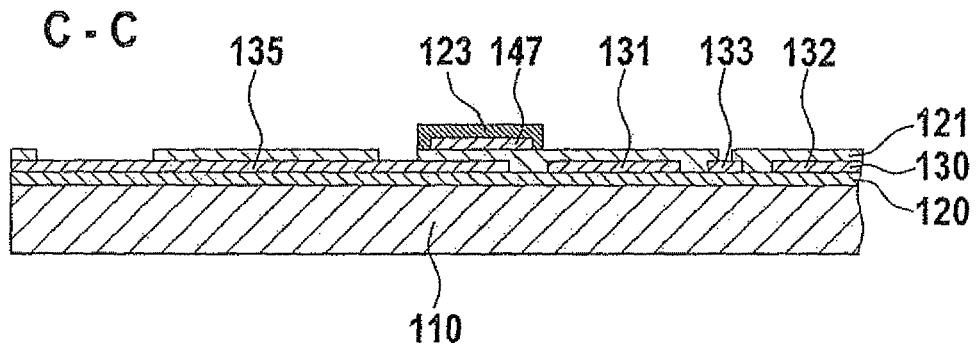
Fig. 38 C-C
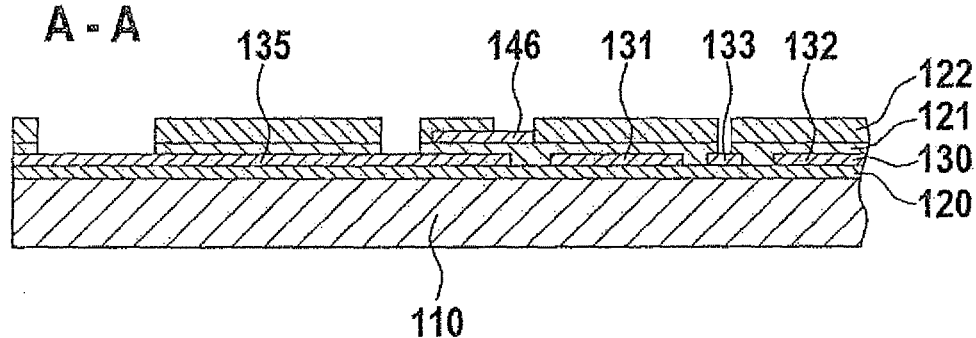
Fig. 39 A-A
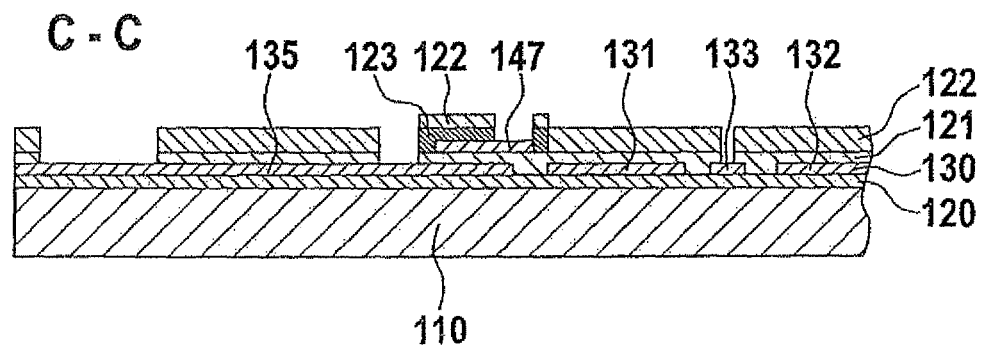
Fig. 40 C-C

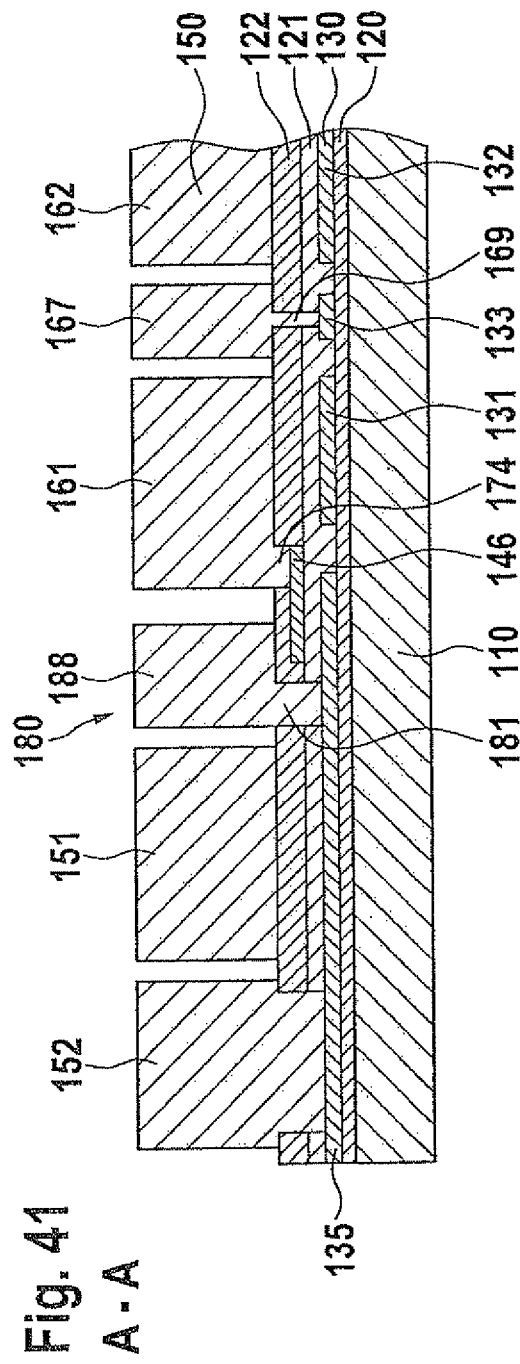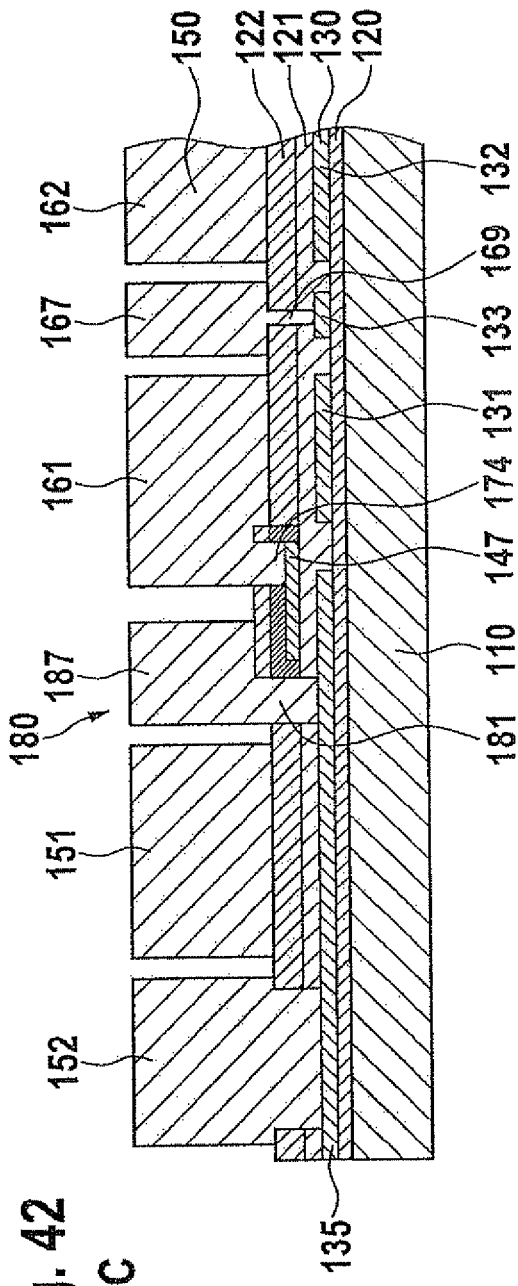

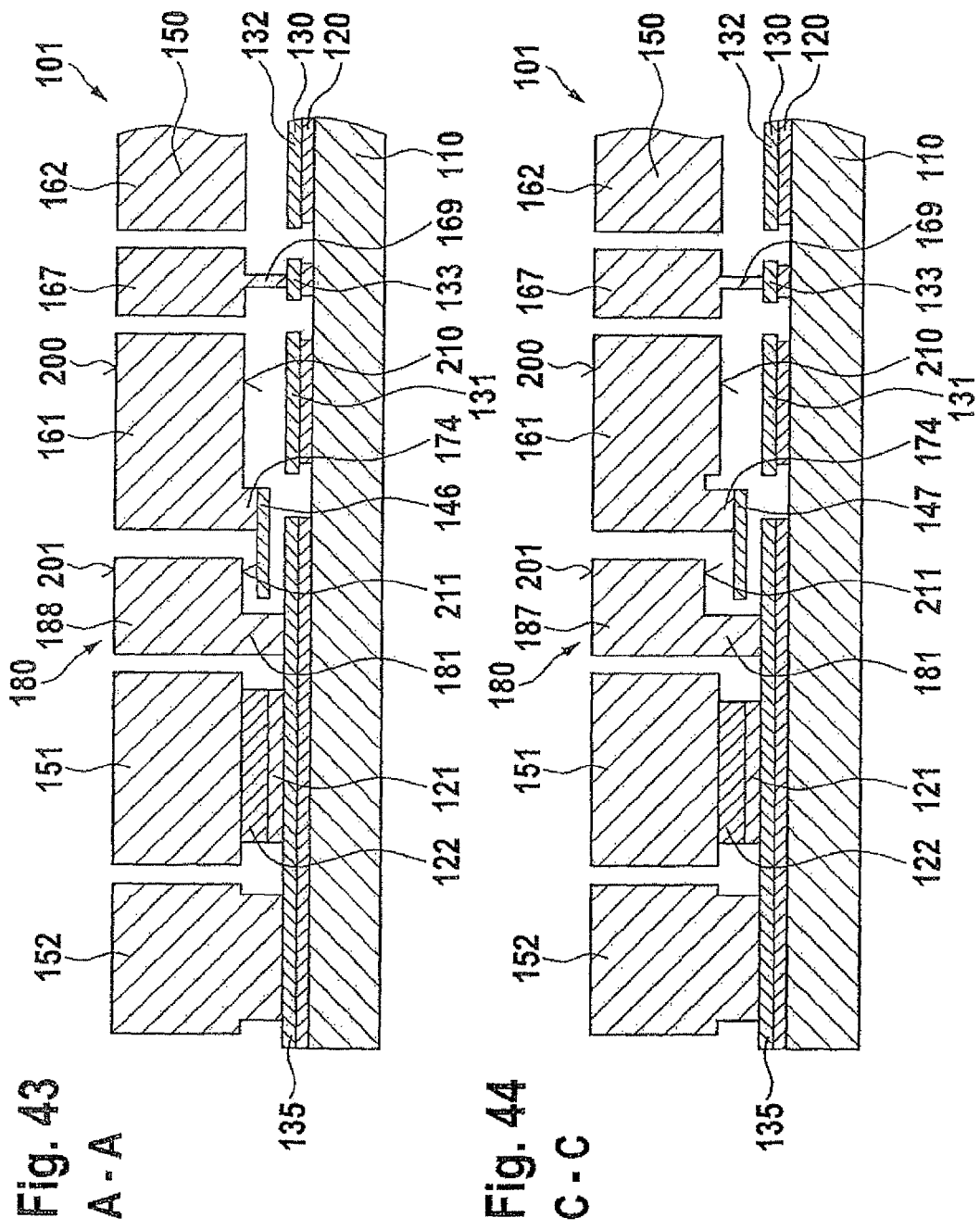

B - B

B - B

MICROMECHANICAL COMPONENT

CROSS REFERENCE

The present application claims the benefit under 35 U.S.C. §119 of German Patent Application No. 102009029095.8 filed on Sep. 2, 2009, which is expressly incorporated herein by reference in its entirety.

FIELD OF THE INVENTION

The present invention relates to a micromechanical component, which has a substrate, a seismic mass which is deflectably situated on the substrate, and a stop structure for delimiting a deflection of the seismic mass in a direction away from the substrate.

BACKGROUND INFORMATION

Micromechanical components, which are used, for example, in the automobile field as acceleration sensors, typically have a movable microstructure. The microstructure, which is also referred to as an MEMS structure (micro-electromechanical system), frequently includes a seismic mass (oscillating mass), which is suspended on a substrate via spring elements. In this case, an acceleration acting on the substrate results in a deflection of the seismic mass in relation to the substrate, which may be detected by suitable measuring methods. In order to delimit the deflection of the movable mass, a stop or a stop structure is conventionally used.

For example, delimiting the lateral movement of a seismic mass, i.e., parallel to a surface of a substrate, is described in German Patent Application No. DE 198 17 357 A1. For this purpose, the seismic mass has through openings, within which stop structures are situated. A micromechanical component is described in U.S. Pat. No. 7,121,141 B2, in which stops are implemented in the form of protruding structural elements on a bottom side of a seismic mass, in order to limit the movement of the seismic mass in the direction of a substrate.

Further micromechanical components having stop structures are described in European Patent Nos. EP 1 307 750 B1 and EP 1 947 053 A2, and U.S. Pat. No. 7,232,701 B2. For this purpose, the components have a functional substrate having a seismic mass and a cap substrate, which is connected to the functional substrate. The cap substrate has stop structures above the seismic mass, with the aid of which the movement of the seismic mass may be limited in a direction away from the functional substrate.

In conventional components, the problem exists that a stop structure may only be situated relatively imprecisely in relation to a seismic mass. This is the case in particular if seismic mass and stop structure are situated on different substrates (functional and cap substrates), which are connected to one another. The implementation of a small, precisely defined distance between stop and seismic mass is therefore only possible with a relatively great manufacturing complexity or not at all. Further disadvantages may be that limiting the deflection of a seismic mass is only possible "suddenly," and a stop structure possibly has an undetermined electrical potential, whereby a reliable operation of a component may be impaired.

SUMMARY

An object of the present invention is to provide an improved micromechanical component having a stop structure. It is a further object of the present invention to provide an improved method for manufacturing a micromechanical component having a stop structure.

A micromechanical component is provided according to an example embodiment of the present invention, which has a substrate, a seismic mass, which is deflectably situated on the substrate, and a stop structure for limiting a deflection of the seismic mass in a direction away from the substrate. The component is distinguished in that the stop structure is situated on the substrate and has a limiting section for limiting the deflection of the seismic mass, which lies in a plane with the seismic mass.

In the micromechanical component, the stop structure is located on the same substrate as the seismic mass. Furthermore, the limiting section of the stop structure and the seismic mass are in a "shared plane," i.e., a top side of the limiting section is generally in a plane with a top side of the seismic mass and a bottom side of the limiting section is generally in a plane with a bottom side of the seismic mass. The possibility is thus provided of situating the seismic mass and the stop structure, which are used for limiting the deflection of the seismic mass away from the substrate, relatively precisely and at a defined distance to one another, whereby a reliable mode of operation of the component is made possible.

In a preferred specific embodiment, a counter-structure is situated on the seismic mass of the component, which comes into contact with the limiting section of the stop structure in the event of a deflection of the seismic mass in a direction away from the substrate. The counter-structure may be situated entirely or partially below the seismic mass in this case and may have different shapes or embodiments, depending on the desired properties. For example, a plate-shaped structure comes into consideration. An elastic structure is also possible, so that "elastic" or "soft" limiting of the movement of the seismic mass is made possible, in order to avoid the risk of damage, for example.

In a further preferred specific embodiment, the seismic mass has, on a bottom side at an edge area, a connection element, which is connected to the counter-structure. The counter-structure protrudes laterally beyond the edge area of the seismic mass in this case. In this manner, the counter-structure is subject to a bending stress upon contact with the stop structure, which may also be combined with elastic stopping.

In a further preferred specific embodiment, the seismic mass has first and second ribs running perpendicularly to the substrate at an edge area. In this case, the counter-structure is situated on bottom sides of the two ribs. The limiting section of the stop structure has a third rib running perpendicularly to the substrate, which protrudes into an area between the first and second ribs of the seismic mass. A configuration of this type may be implemented in a relatively space-saving manner. In addition, the counter-structure is generally subject to tensile stress upon contact with the limiting section of the stop structure, whereby robust and stable stopping is made possible.

In a further preferred specific embodiment, the seismic mass has a through opening adjoining an edge area and has protruding ridges on a bottom side in the area of the opening, on which the counter-structure is situated. The limiting section of the stop structure protrudes into an area enclosed by the opening in this case. A high stability may also be achieved for the stopping in this manner.

In a further preferred specific embodiment, the stop structure is situated on a conductive layer of the substrate. In this manner, the possibility exists of applying a predefined electrical potential to the stop structure. The occurrence of a potential difference between the seismic mass and the stop structure, as well as negative effects and influences associated therewith, for example, on an analysis circuit used during operation of the component, may thus be avoided. Sparking upon or before stopping on the stop structure and impairment of the micromechanical component associated therewith may also be prevented. In addition, the distance between the limiting section of the stop structure and the seismic mass (or its counter-structure) and thus the freedom of movement of the seismic mass may be selected as relatively small without negative consequences.

In a further preferred specific embodiment, the micromechanical component has a further layer situated on the substrate in an area below the limiting section of the stop structure, with the aid of which a deflection of the seismic mass in a direction toward the substrate is limited. This layer may be the above-described conductive layer in particular.

Furthermore, an example method for manufacturing a micromechanical component is provided according to the present invention. The example method includes provision of a substrate, implementation of a deflectable seismic mass situated on the substrate, and implementation of a stop structure having a limiting section for limiting a deflection of the seismic mass in a direction away from the substrate. The method is distinguished in that the seismic mass and the stop structure are implemented from a shared functional layer on the substrate. The method thus offers the possibility of situating the seismic mass and the stop structure with high precision and at a defined distance to one another, whereby a reliable mode of operation of the component is made possible.

In a preferred specific embodiment, the method further includes implementation of a counter-structure situated on the seismic mass, which comes into contact with the limiting section of the stop structure in the event of a deflection of the seismic mass in a direction away from the substrate.

In a further preferred specific embodiment, the method further includes performing a sacrificial layer method by implementing and removing a sacrificial layer, in order to set a distance, which exists in an initial position of the seismic mass, between the limiting section of the stop structure and the counter-structure. The distance may be fixed at high precision by this procedure. A relatively small distance may also be implemented, whereby a reliable mode of operation of the component is further favored.

BRIEF DESCRIPTION OF THE DRAWINGS

The present invention is explained in greater detail below on the basis of the figures.

FIGS. 26 through 29 show a further functional substrate in various schematic sectional and top views.

FIGS. 30 through 33 show a further functional substrate in various schematic sectional and top views.

FIGS. 37 through 44 show the manufacturing of a further functional substrate, in a schematic sectional view in each case.

DETAILED DESCRIPTION OF EXAMPLE EMBODIMENTS

The micromechanical components which are described on the basis of the figures, and which are also referred to as "Z sensors," have a seismic mass, which is situated on a substrate, in the form of a rotatable rocker structure having two lever arms. To limit a deflection of a lever arm of the seismic mass in a direction away from the substrate, the components further have an associated stop structure, which is separate from the seismic mass, and which is situated with high precision and at a defined (small) distance in relation to the seismic mass. Furthermore, possible advantageous methods for manufacturing the components are described. In this manner, for example, components may be implemented in which the freedom of movement of a seismic mass is limited to (significantly) less than 2 μm.

Figure 1:
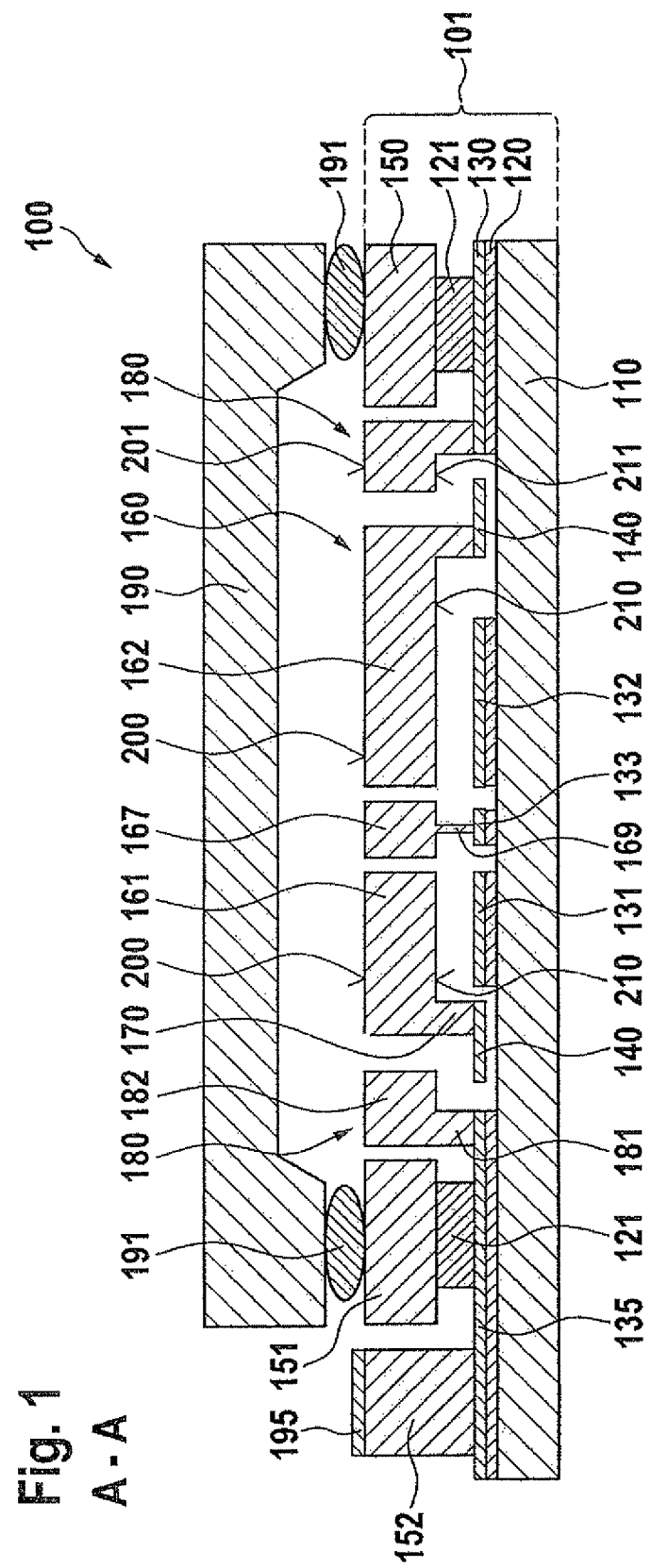
FIG. 1 shows a schematic lateral sectional view of a micromechanical component having a stop structure.
Figure 2:
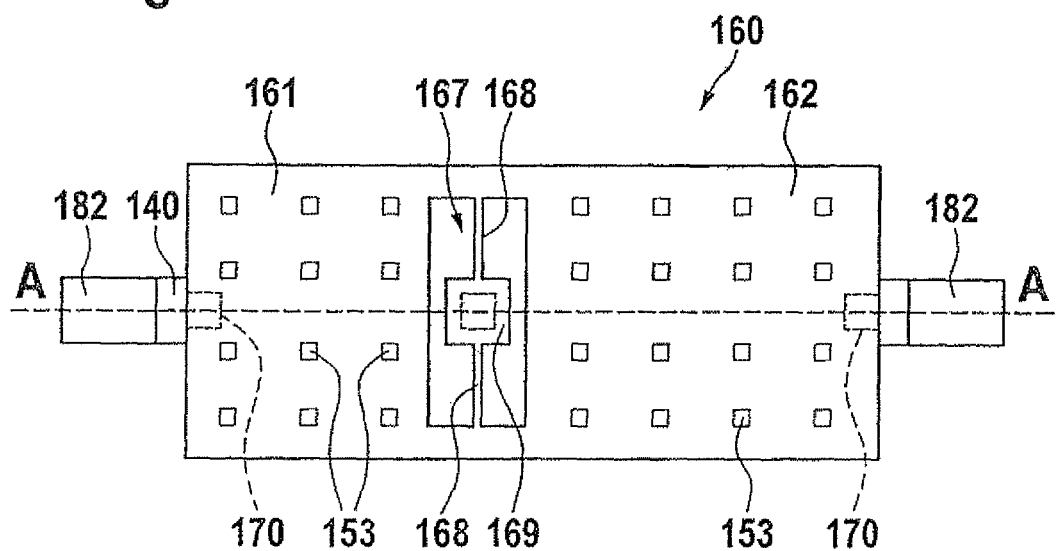
FIGS. 2 and 3 show various schematic top views of parts of the component from FIG. 1.
Figure 3:
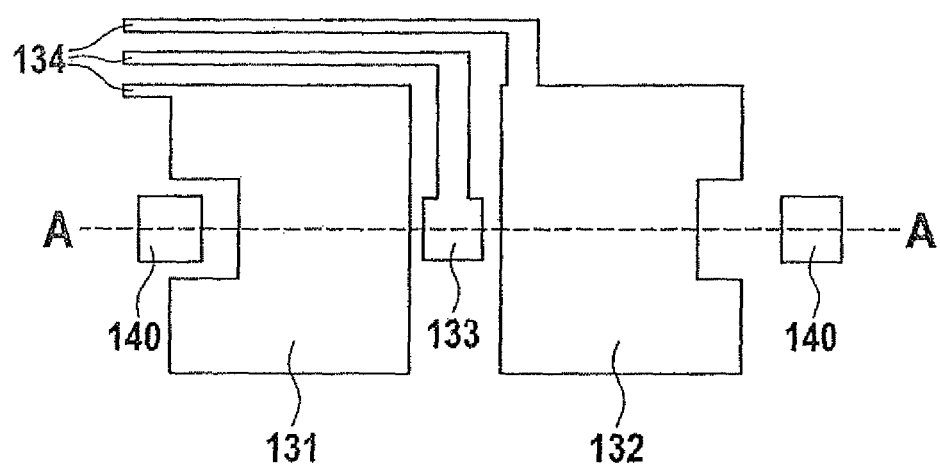

FIGS. 1 through 3 show a micromechanical component 100 in various schematic views, FIG. 1 including a lateral sectional view and FIGS. 2 and 3 including top views of parts of component 100. For illustration, FIGS. 2 and 3 also contain an illustration of a section line A-A, which refers to the sectional view of FIG. 1.

As shown in FIG. 1, component 100 has a functional substrate 101 having a movable microstructure and a cap substrate 190, which is connected to functional substrate 101, for hermetically sealing the microstructure. Functional substrate 101 includes a base substrate 110, on which multiple structured layers are situated one on top of another. These include an insulating layer 120, a conductive layer 130, an insulating sacrificial layer 121, and a conductive functional layer 150. Possible materials of these layers are detailed below in connection with an example manufacturing method.

A part of structured functional layer 150 is implemented as a rocker structure 160 having a first lever arm 161 and a second lever arm 162, which have different lengths. As shown in FIG. 2, a perforated structure having through holes 153 is provided in rocker structure 160, through which an etching medium used in the manufacturing for exposing rocker 160 may be conducted. A carrier structure 167 for the rotatable mounting of rocker structure 160 is situated in an area between lever arms 161, 162, which has two torsion springs or torsion webs 168 connected to a support element 169. Rocker structure 160 is connected via support element 169 to substrate 110 or a subarea 133 of conductor layer 130. In addition to subarea 133, conductive layer 130 also includes a first and a second planar electrode 131, 132, whose lateral structure is shown on the basis of the top view of FIG. 3.

Because of the different lengths of lever arms 161, 162, rocker structure 160 has a mass asymmetry in relation to a rotational axis predefined by torsion webs 168. In an acceleration which acts perpendicularly to the substrate plane or surface of substrate 110, this example embodiment causes a rotation of rocker structure 160, i.e., one of two lever arms 161, 162 is moved in a direction away from substrate 110 and the other of lever arms 161, 162 is moved in the direction of substrate 110. The deflection of rocker structure 160 is a function of the magnitude of the acting acceleration force, which is detected in a capacitive manner in component 100.

In this case, both electrodes 131, 132 having lever arms 161, 162 situated above them each form a capacitor. The rotational movement of rocker structure 160 due to an acting acceleration (perpendicular to substrate 110) results in a distance change between electrodes 131, 132 and lever arms 161, 162, and thus a capacitance change. The acceleration force may therefore be detected by measuring the capacitance or capacitance change. During the measurement, appropriate electrical potentials are applied to rocker structure 160 and both electrodes 131, 132. For this purpose, conductive layer 130 includes, as shown in FIG. 3, printed conductors 134, which are connected to electrodes 131, 132 and subarea 133 (which contacts rocker structure 160 via support element 169).

As shown in FIG. 1, a further part of functional layer 150 is implemented on both sides of seismic mass or rocker structure 160 in the form of stop structures 180, with the aid of which the movement of lever arms 161, 162 in a direction away from substrate 110 in a rotational movement of rocker structure 160, and thus stressing torsion webs 168, which occur in this case, may be limited. Each of both stop structures 180 includes a support element 181 connected to substrate 110 (via layers 120, 130) and a limiting section 182, which protrudes laterally beyond support element 181 in the direction of rocker structure 160, for limiting the deflection of one of lever arms 161, 162. As shown in FIG. 2, a limiting section 182 may have a rectangular shape in the top view.

In addition, a layered or plate-shaped counter-structure 140, which is used as an "auxiliary layer," is provided on rocker structure 160 on each side or below each lever arm 161, 162, which comes into contact with limiting section 182 of an associated stop structure 182 in the event of the deflection of lever arms 161, 162 in a direction away from substrate 110, in order to limit the deflection. Each counter-structure 140 is connected via a connection element 170 to one of lever arms 161, 162. Connection elements 170, which are also part of functional layer 150, are provided on a bottom side of lever arms 161, 162 at an edge area. Counter-structures 140 each protrude laterally beyond the edge area of rocker structure 160, as is obvious from FIG. 1. As shown in FIG. 2, counter-structures 140 and limiting section 182 of stop structures 180 may have the same width.

Counter-structures 140 are structured from conductive layer 130, like electrodes 131, 132 and subarea 133. A possible position of (rectangular or square) counter-structures 140 is also obvious on the basis of the top view of FIG. 3. Electrodes 131, 132 may have corresponding lateral formations or openings in order to avoid contact, which would impair a capacitance measurement, between counter-structures 140 (which have the same electrical potential as rocker structure 160) and electrodes 131, 132.

In functional substrate 101, limiting section 182 of stop structures 180 is in a plane with rocker structure 160. This means that a top side 201 of a limiting section 182 is generally in a plane with a top side 200 of rocker structure 160 (or an associated lever arm 161, 162), and a bottom side 211 of a limiting section 182 is essentially in a plane with a bottom side 210 of rocker structure 160 (without connection elements 170 and counter-structures 140), as is shown in FIG. 1. Through this design, stop structures 180, which are situated laterally to rocker structure 160, may have a relatively precise position in relation to rocker structure 160. The distance between a limiting section 182 and an associated counter-structure 140 and thus the freedom of movement of rocker structure 160 may also be established with high precision, whereby rocker structure 160 has a reliable and defined stop behavior. The "setting" of a precise distance is further achieved or promoted in that both stop structures 180 and rocker structure 160 originate jointly from functional layer 150. The above also applies to the alternative specific embodiments of functional substrates 101, which are explained on the basis of the further figures.

A further section 151 protruding from functional layer 150, which is situated on a section of sacrificial layer 121, is provided laterally to each of stop structures 180 as shown in FIG. 1. Both sections 121, 151 are situated in a frame shape around stop structures 180 and rocker structure 160 and connected via a connection medium 191 to cap substrate 190, in order to provide a hermetically sealed interior in the area of rocker structure 160. For example, an adhesive, a seal glass, or a eutectic alloy comes into consideration as the material for connection medium 191.

In component 100, it is provided that a predefined electrical potential is also to be applied to stop structures 180, in addition to electrodes 131, 132 and rocker structure 160. In this manner, for example, the occurrence of an undesired parasitic capacitance between stop structures 180 and seismic mass or rocker structure 160 may be suppressed, whereby negative influences are avoided, for example, on an analysis circuit used for the capacitance measurement during the operation of component 100. Furthermore, the distance between a stop structure 180 or its limiting section 182 and a counter-structure 140 may be selected as relatively small without negative consequences.

For this purpose, as shown in FIG. 1, conductive layer 130 is structured in the form of a further subarea 135 (which is separate from electrodes 131, 132 and subarea 133), on which stop structures 180 and, outside the "encapsulated" interior, a contact element 152 formed from functional layer 150 are situated. Contact element 152 may be provided on the top side with a metallic layer 195, in order to allow attachment of a bonding wire, for example. Contact elements corresponding to contact element 152, which are connected to printed conductors 134 (not shown), are also provided outside the cavity for an external contact with respect to electrodes 131, 132 and subarea 133.

FIGS. 4 through 7 show, each in a lateral sectional view, a possible method for manufacturing functional substrate 101 of component 100 of FIG. 1. Processes and materials which are typical in semiconductor and microsystem technology may be used during the manufacturing. With respect to counter-structures 140 and stop structures 182, which are situated on both sides of rocker structure 160, only the structures provided in the area of left lever arm 161 are illustrated. This detail view is sometimes also used in other figures.

Figure 4:
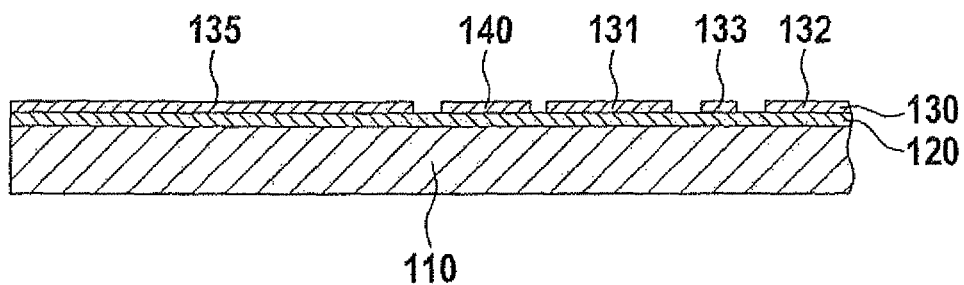
FIGS. 4 through 7 show the manufacturing of a functional substrate of the component from FIG. 1, in a schematic lateral sectional view in each case.

At the beginning of the example manufacturing method, a semiconductor substrate 110 is provided, which may be a silicon wafer, for example. Subsequently, an insulating layer 120 is applied to substrate 110 and a conductive layer 130 is applied to insulating layer 120. Insulating layer 120 may be a silicon oxide layer, for example, which insulates conductive layer 130 in relation to substrate 110. Conductive layer 130 may be a (doped) polysilicon layer, for example. Conductive layer 130 is also subjected, as shown in FIG. 4, to structuring in order to implement both electrodes 131, 132, subareas 133, 135, counter-structures 140, and printed conductors 134 (not shown in FIGS. 4 through 7).

Figure 5:
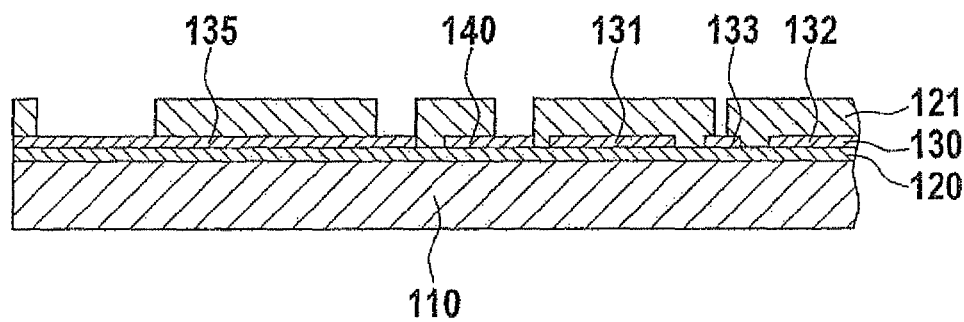

Following this, as shown in FIG. 5, a sacrificial layer 121 is applied to structured conductive layer 130 and insulating layer 120. Sacrificial layer 121 may be a silicon oxide layer. Sacrificial layer 121 is also subjected to structuring in order to implement openings, through which conductive layer 130 is exposed at predefined points of subareas 133, 135 and counter-structures 140.

Figure 6:
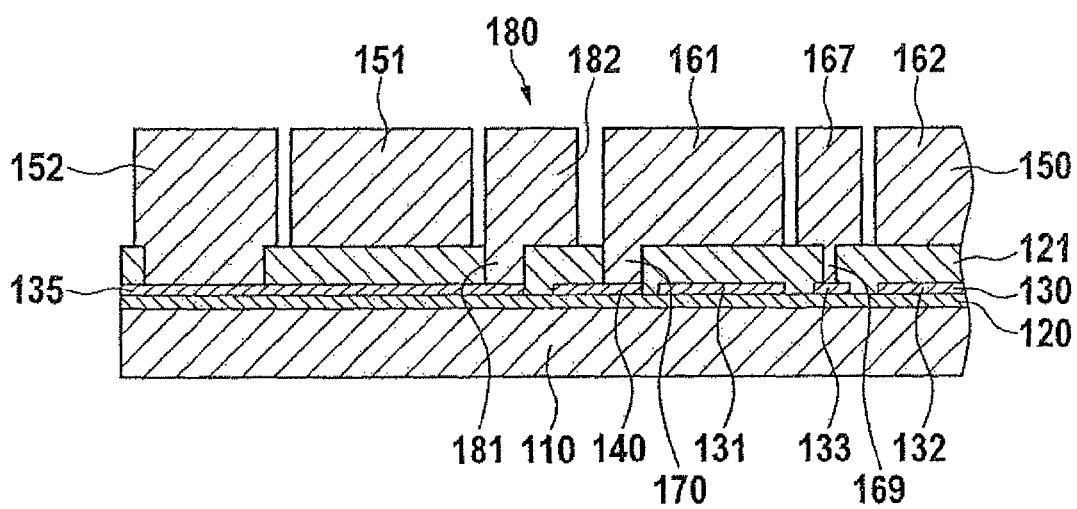

Subsequently, as shown in FIG. 6, a functional layer 150 is applied to structured sacrificial layer 121 and "between" sacrificial layer 121 to the exposed areas of conductive layer 130. Functional layer 150 is, for example, a so-called epipolysilicon layer, i.e., a polycrystalline silicon layer produced using an epitaxial method, which may optionally be implemented as doped. Functional layer 150 is also subjected to structuring ("trenching"), in order to implement rocker structure 160 having both lever arms 161, 162 and carrier structure 167 (including openings 153 shown in FIG. 2), stop structures 180, section 151, and contact element 152. In contrast, the shape of support elements 169, 181 of carrier structure 167 and stop structures 180 and connection elements 170, which are connected to counter-structures 140, are fixed by the openings structured in sacrificial layer 121 before the application of functional layer 150.

Figure 7:
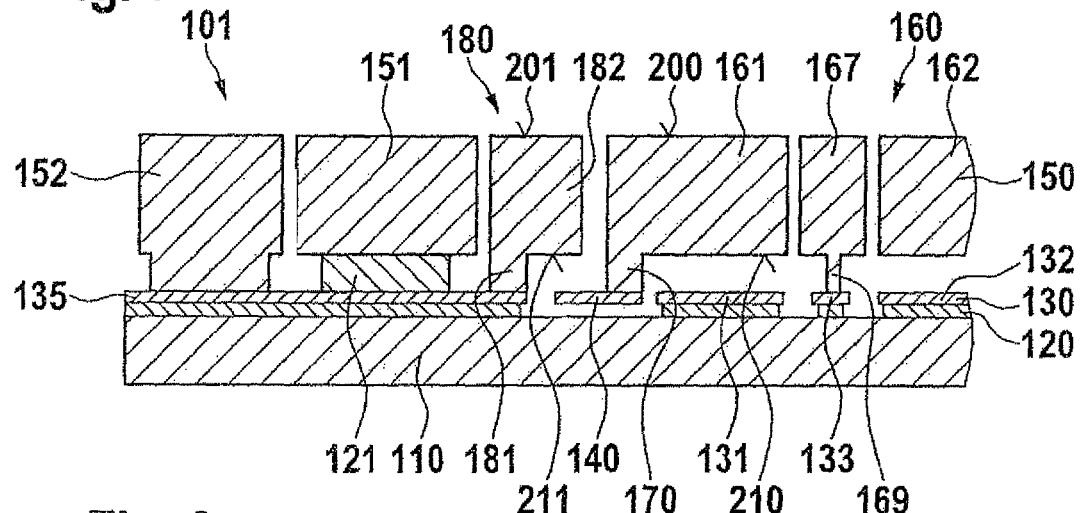

For the subsequent exposure of rocker structure 160, an etching medium or etching gas, such as hydrofluoric acid vapor, is conducted through structured functional layer 150 and in particular through openings 153 of rocker structure 160 (cf. FIG. 2) to sacrificial layer 121, whereby a majority of sacrificial layer 121 is removed as shown in FIG. 7 (except for an area below section 151). The etching medium used for the sacrificial layer removal may also reach insulating layer 120, whereby insulating layer 120 is removed locally (in particular below counter-structures 140) and underetched somewhat laterally below conductive layer 130, and the structure shown in FIG. 7 results.

In addition to the joint production of stop and rocker structures 160, 180 from functional layer 150, the precise setting of a distance between limiting section 182 and counter-structure 140 is made possible in particular by the implementation and removal of sacrificial layer 121. A relatively small distance (existing in the initial position of rocker structure 160) between limiting section 182 and counter-structure 140 of, for example, 1 µm may also be implemented by performing such a sacrificial layer method, whereby the risk of damage, in particular of torsion webs 168 in the event of a deflection of rocker structure 160, may be reliably avoided. This also applies to the other alternative manufacturing methods which are explained on the basis of the figures.

Following the described example method steps, further steps may be performed to complete a functional substrate 101 or component 100. These include, for example, back thinning of substrate 110 and an isolation process, in order to provide functional substrates 101 which are separate from one another. Furthermore, a connection of functional substrate 101 to a cap substrate 190 (cf. FIG. 1), in order to implement a hermetically sealed interior in the area of rocker structure 160, also comes into consideration. This also applies in a corresponding manner for the other specific embodiments explained on the basis of the figures. Furthermore, it is to be noted that the above-mentioned materials may also be used in the following specific embodiments.

Instead of implementing a counter-structure which cooperates with a stop structure in the same layer plane as printed conductors and electrodes, a counter-structure may also be produced by implementing a separate layer in a different layer plane. For illustration, FIGS. 8 through 13—each in a lateral sectional view—show a further method for manufacturing a functional substrate 101.

Figure 8:
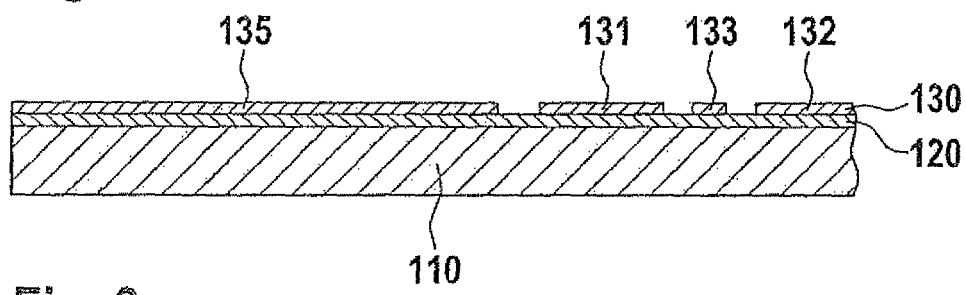
FIGS. 8 through 13 show the manufacturing of a further functional substrate having a stop structure, in a schematic lateral sectional view in each case.
Figure 9:
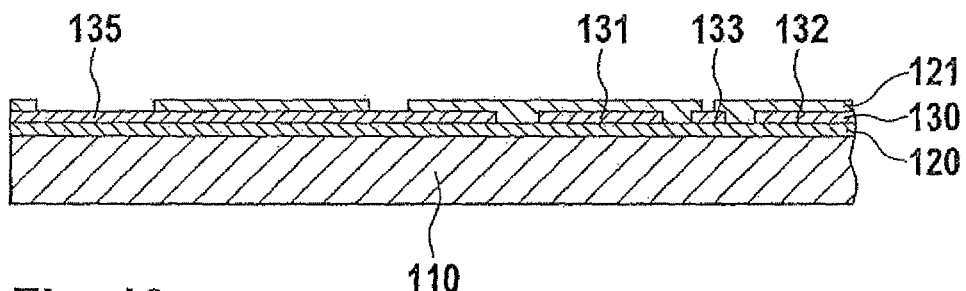

In this method, a substrate 110 is provided, an insulating layer 120 is applied to substrate 110 and a conductive layer 130 is applied to the insulating layer. Conductive layer 130 is also structured, as shown in FIG. 8, in order to implement two electrodes 131, 132, printed conductors (not shown), and subareas 133, 135. Subsequently, as shown in FIG. 9, a first sacrificial layer 121 is applied to layers 120, 130 and structured in order to expose conductive layer 130 at predefined areas.

Figure 10:
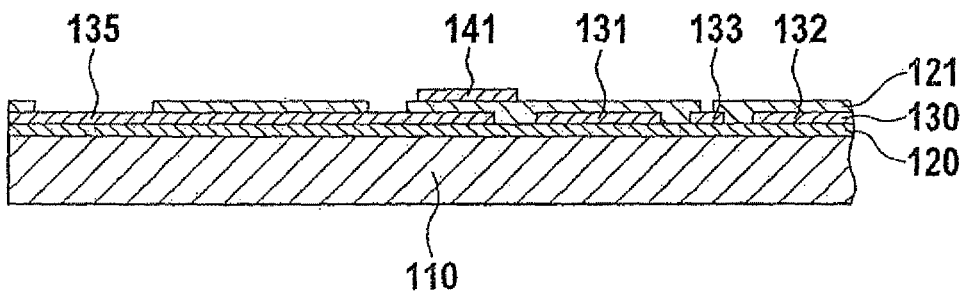
Figure 11:
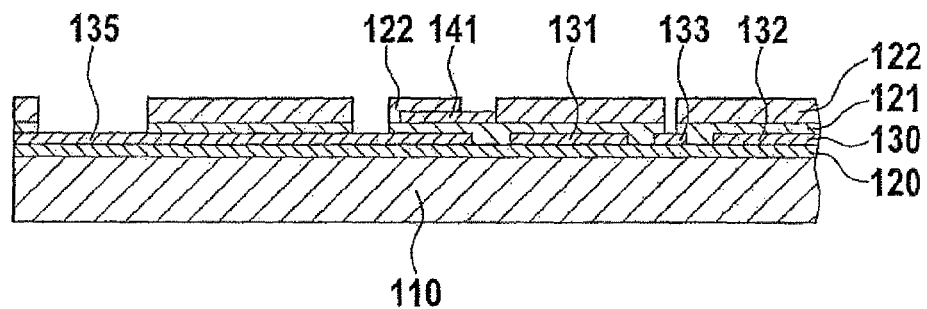

Following this, a further conductive layer is implemented and structured on sacrificial layer 121 in order, as shown in FIG. 10, to implement a counter-structure 141 in an area above conductive layer 130 or above subarea 135 (on each side of later rocker structure 160). (Doped) polysilicon again comes into consideration as the material for this conductive layer or counter-structure 141. Furthermore, as shown in FIG. 11, a second sacrificial layer 122 is implemented and structured, so that conductive layer 130 and counter-structure 141 are exposed at predefined locations. Second sacrificial layer 122 may have, silicon oxide like first sacrificial layer 121.

Figure 12:
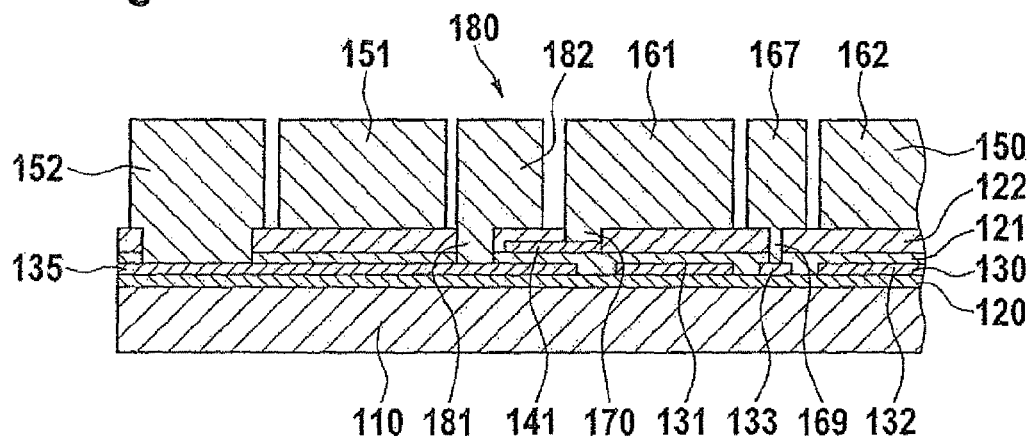

Subsequently, as shown in FIG. 12, a functional layer 150 is applied to sacrificial layer 122 and to uncovered areas of counter-structure 141 and conductive layer 130. Functional layer 150 is also structured, in order to implement a rocker structure 160 having lever arms 161, 162, a carrier structure 167, a stop structure 180 (on each lever arm 161, 162), and a section 151 and a contact element 152. Rocker structure 160 may have a shape corresponding to FIG. 2 (including openings 153) in the top view. Furthermore, support elements 169, 181 of carrier structure 167 and stop structure 180 and a connection element 170, which is connected to counter-structure 141 (on each lever arm 161, 162) are produced at the previously exposed locations of counter-structure 141 and conductive layer 130 by the application of functional layer 150. Subsequently, an etching medium or etching gas is conducted through structured functional layer 150 to sacrificial layers 121, 122 and insulating layer 120, whereby affected layers 120, 121, 122 are (partially) removed and functional substrate 101 shown in FIG. 13 is generally finished.

In the example method shown in FIGS. 8 through 13, in contrast to the method explained on the basis of FIGS. 4 through 7, the distance between limiting section 182 of stop structure 180 and counter-structure 141 is set via second sacrificial layer 122. Furthermore, subarea 135 of conductive layer 130, which is situated below counter-structure 141, forms a further stop structure, with the aid of which defined stopping of counter-structure 141 is made possible in the event of a deflection of rocker structure 160 or a lever arm 161, 162 in the direction of substrate 110. An electrical potential having the above-described advantageous effects may again be applied to subarea 135 via contact element 152.

Figure 13:
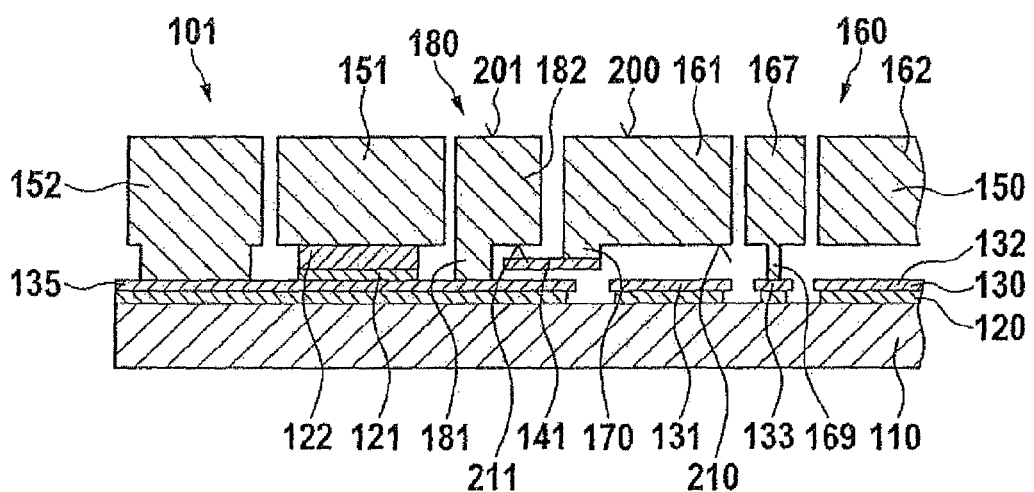
Figure 14:
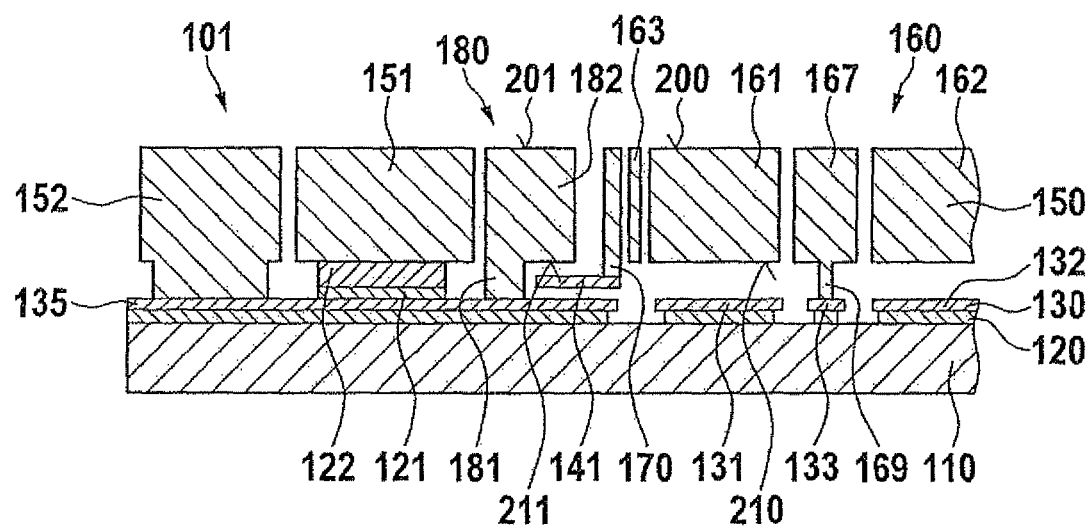
FIGS. 14 and 15 show a schematic lateral sectional view and a top view of a further functional substrate.
Figure 15:
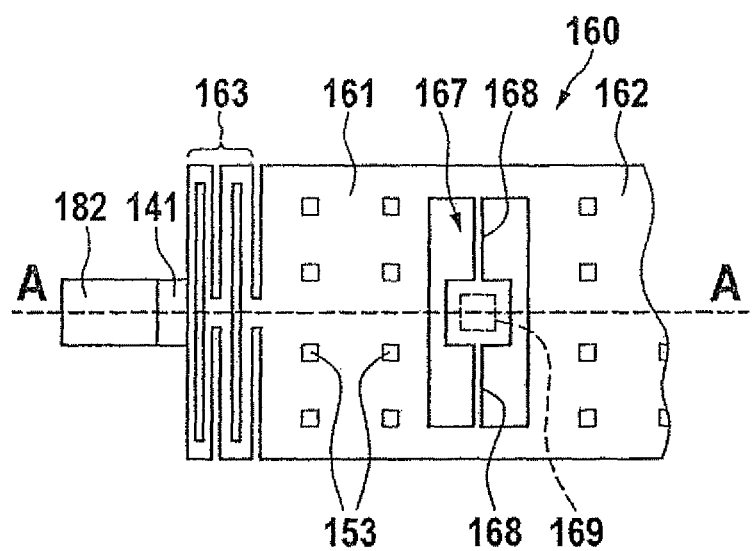

FIGS. 14 and 15 show an alternative functional substrate 101 in a lateral sectional view (along a section line A-A) and in a top view, which generally corresponds to functional substrate 101 of FIG. 13 and may be manufactured by performing similar method steps. In this case, rocker structure 160 additionally has a section 163 at the edge of each lever arm 161, 162, which is implemented in the form of an elastic structure (only shown for lever arm 161 in FIGS. 14 and 15). Elastic section 163, whose shape may be established during the structuring of fundamental functional layer 150, includes, as shown in FIG. 15, openings situated inside rocker structure 160 and lateral notches, for example, which each have the form of oblong slots. At the edge of section 163, as shown in FIG. 14, a connection element 170 is again provided on the bottom side, to which a counter-structure 141 is connected.

The embodiment of rocker structure 160 having an elastic section 163 on lever arms 161, 162 allows "soft" or "decelerated" contact of a limiting section 182 of a stop structure 180 (and a subarea 135 in the present case) by a counter-structure 141. In contrast to sudden or "hard" stopping, in this manner the risk of damage to a stop structure 180, a lever arm 161, 162, a torsion web 168, and/or a counter-structure 141 may be avoided.

Figure 16:
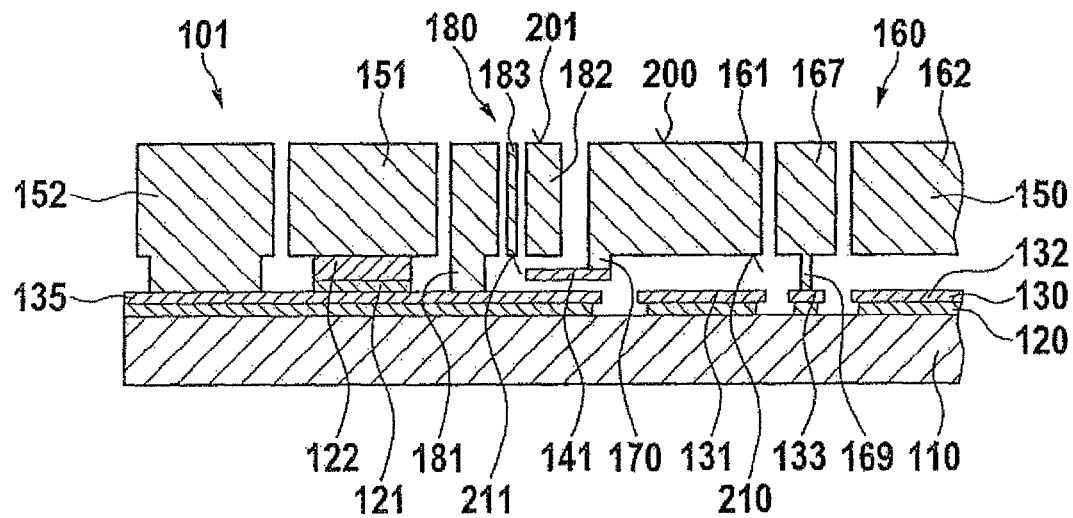
FIGS. 16 and 17 show a schematic lateral sectional view and a top view of a further functional substrate.
Figure 17:
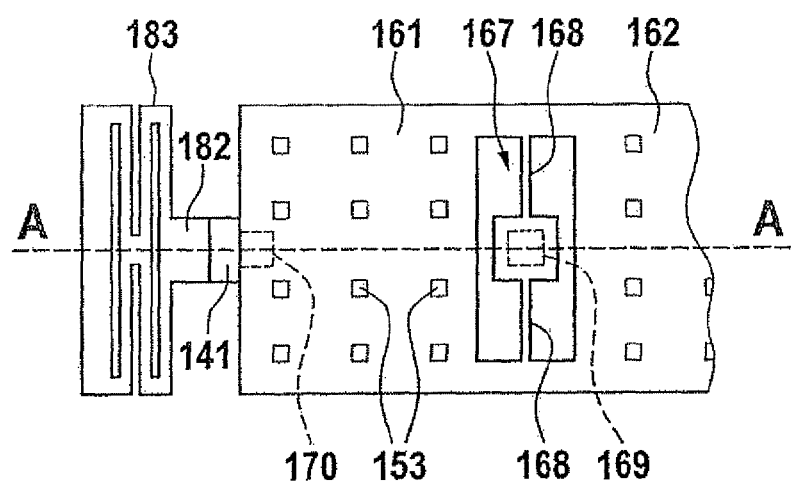

A further alternative embodiment of a functional substrate 101 is shown in a lateral sectional view (along a section line A-A) and a top view in FIGS. 16 and 17. In this case, a stop structure 180 or its limiting section 182 has an elastic section 183 at the edge, which also allows "soft" or elastic limiting of movement of rocker structure 160. Elastic section 183, whose shape may again be fixed during the structuring of fundamental functional layer 150, includes, as shown in FIG. 17, for example, openings, which are situated inside rocker structure 160, and lateral notches, which are each implemented in the form of oblong slots.

Furthermore, the possibility exists, with respect to illustrated elastic sections 163, 183 of rocker structure 160 and stop structure 180, of implementing a functional substrate, in which both the rocker structure and also the stop structures have appropriate elastic areas. Furthermore, functional substrate 101, which was explained on the basis of FIGS. 1 through 7, may be provided with elastic sections of this type on rocker and/or stop structures 160, 180. This also applies similarly to the specific embodiments explained on the basis of the further figures.

FIGS. 18 through 36 show further alternative embodiments of functional substrates 101 in various schematic sectional and top views, the sectional views relating to section lines A-A and B-B, which are shown in the top views. In these specific embodiments, which may be produced by performing method steps similar to the method explained on the basis of FIGS. 8 through 13, "interlocking" of a stop structure 180 and a rocker structure 160 is provided. The figures show details only in the area of the left side of rocker structure 160. However, similar structures may also be provided in the area of the right side.

Figure 18:
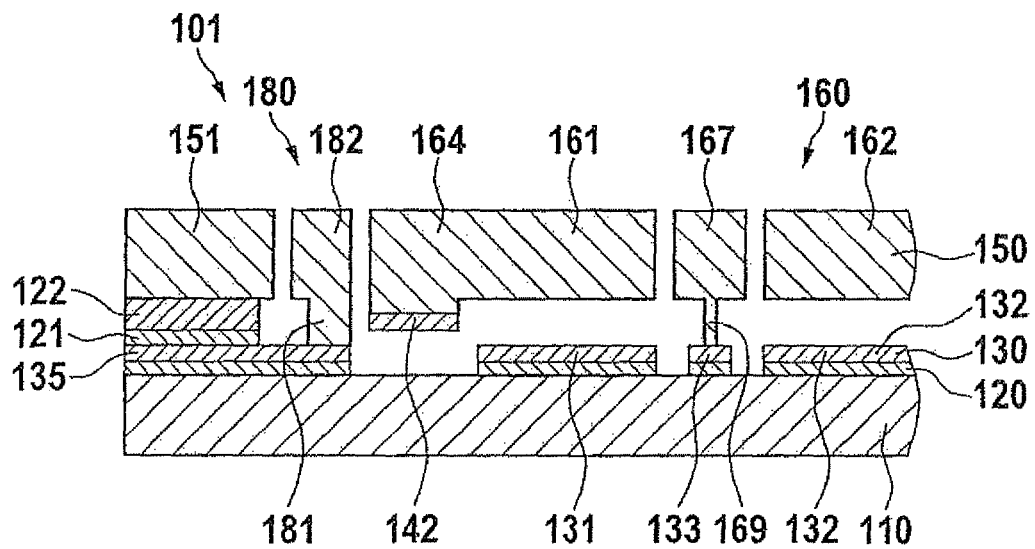
FIGS. 18 through 21 show a further functional substrate in various schematic sectional and top views.
Figure 19:
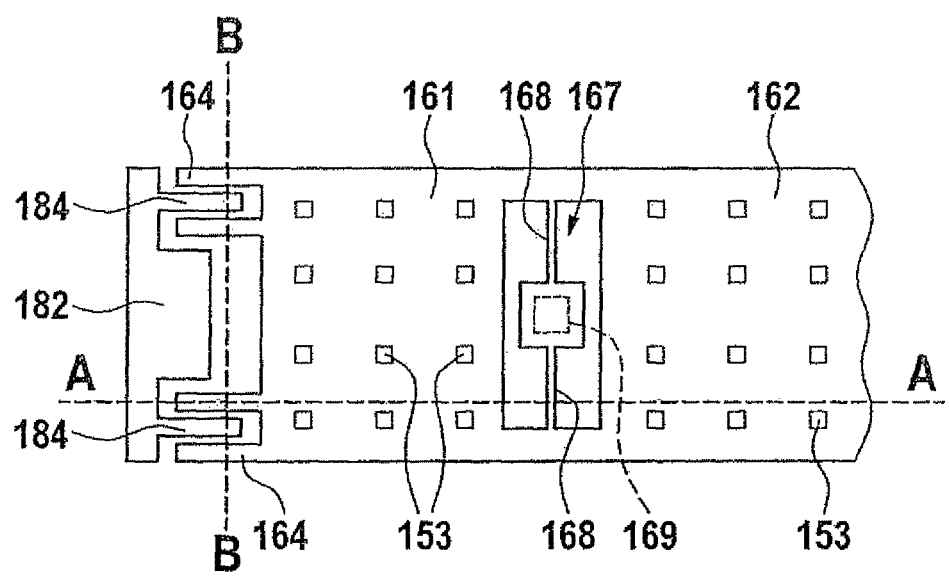
Figure 20:
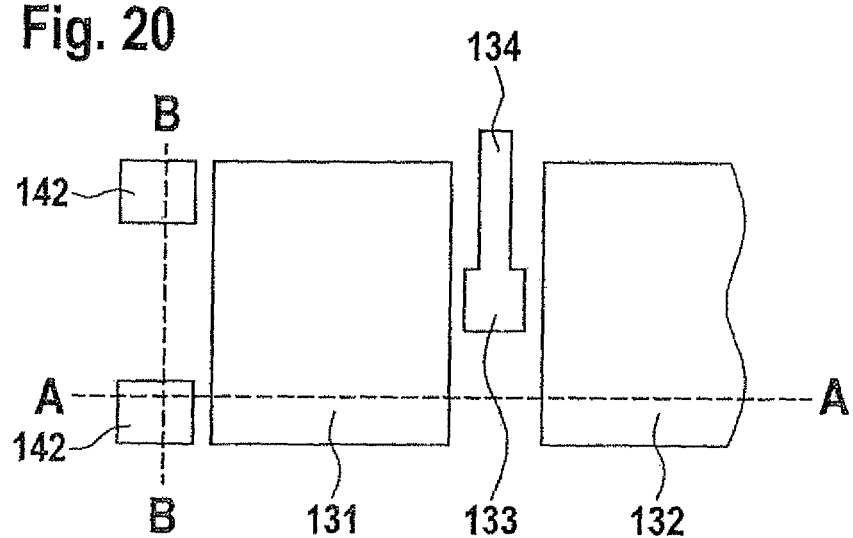
Figure 21:
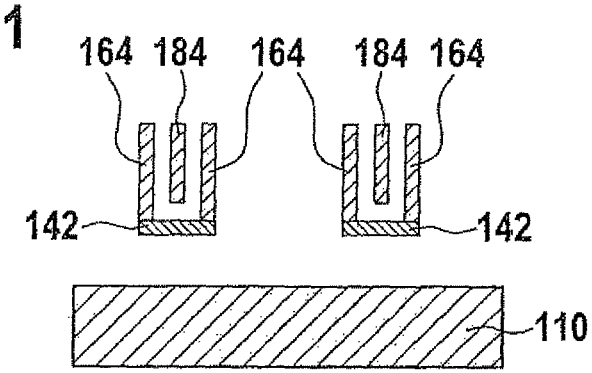

FIGS. 18 through 21 show a functional substrate 101, whose rocker structure 160 has four ribs 164 running perpendicularly to substrate 110 at the edge of each lever arm 161, 162, as shown in FIGS. 19 through 21. As shown in FIG. 21, a plate-shaped counter-structure 142 is situated on the bottom sides of each two ribs 164. The lateral position of counter-structures 142, which are provided on lever arm 161, in relation to the electrode 131 is shown in the top view of FIG. 20. Counter-structures 142 are located, as is shown in FIG. 18, in a different layer plane than electrodes 131, 132 or conductive layer 130, however.

A stop structure 180 is provided in each case on both sides of rocker structure 160, whose limiting section 182 has two further ribs 184 running perpendicularly to substrate 110. One rib 184 of limiting section 182 protrudes, as shown in FIG. 19, into each area between two ribs 164 of rocker structure 160 or, as shown in FIG. 21, is enclosed in a U-shape by ribs 164 and counter-structure 142, which is situated on the bottom side of ribs 164.

A stable and relatively space-saving configuration is made possible by the interlocking of rocker and stop structures 160, 180 with the aid of ribs 164, 184. Furthermore, a counter-structure 142 which is fastened to the bottom side of two ribs 164 is generally subject to a tensile stress upon contact with a rib 184 of an associated limiting section 182, whereby robust or stable stopping is made possible. Furthermore, the possibility thus exists of producing counter-structure 142 having a small layer thickness (in relation to conductive layer 130).

Functional substrate 101 of FIGS. 18 through 21 may be manufactured by performing steps corresponding to the method explained on the basis of FIGS. 8 through 13. In this case, illustrated ribs 164 of rocker structure 160 are produced by structuring a previously applied functional layer 150. This also applies to ribs 184 of stop structure 180. To manufacture the connection between ribs 164 and an associated counter-structure 142, a (second) sacrificial layer, which is applied after the implementation of counter-structure 142, is partially removed before the application of functional layer 150, whereby counter-structure 142 is partially exposed. This sacrificial layer is further used for the purpose of setting a distance between counter-structure 142 and an associated limiting section 182 or its rib 184 with high precision.

Instead of functional substrate 101 shown in FIGS. 18 through 21, a functional substrate having a different number of interlocking ribs 164, 184 may also be implemented. In addition, a plate-shaped counter-structure 142, which is situated on the bottom side of two ribs 164 of a rocker structure 160, may also be implemented in the same layer plane as electrodes 131, 132 or may originate from the same conductive layer 130. A specific embodiment of this type may be manufactured by performing method steps corresponding to the example method explained on the basis of FIGS. 4 through 7.

Figure 22:
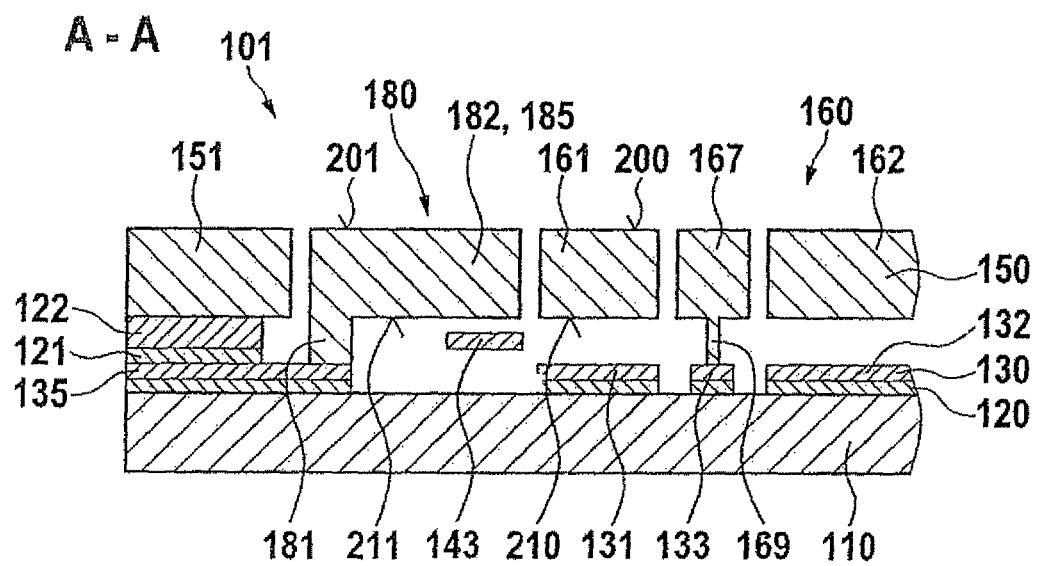
FIGS. 22 through 25 show a further functional substrate in various schematic sectional and top views.
Figure 23:
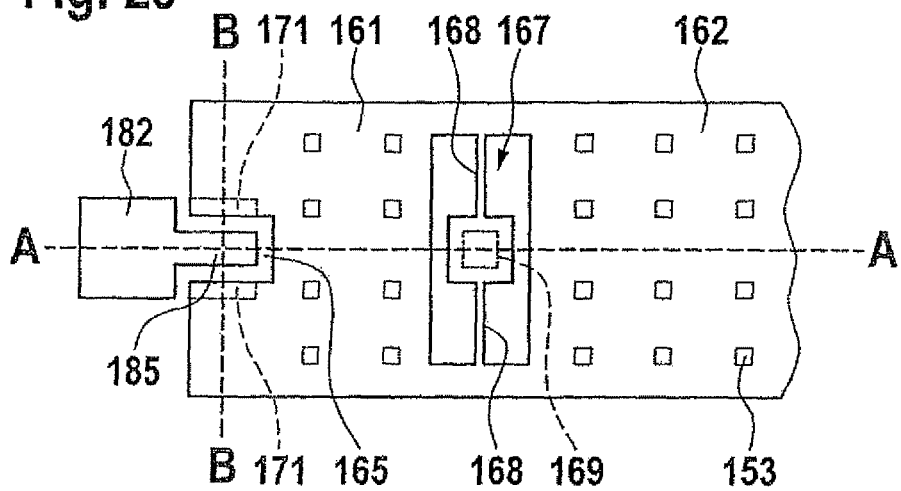
Figure 24:
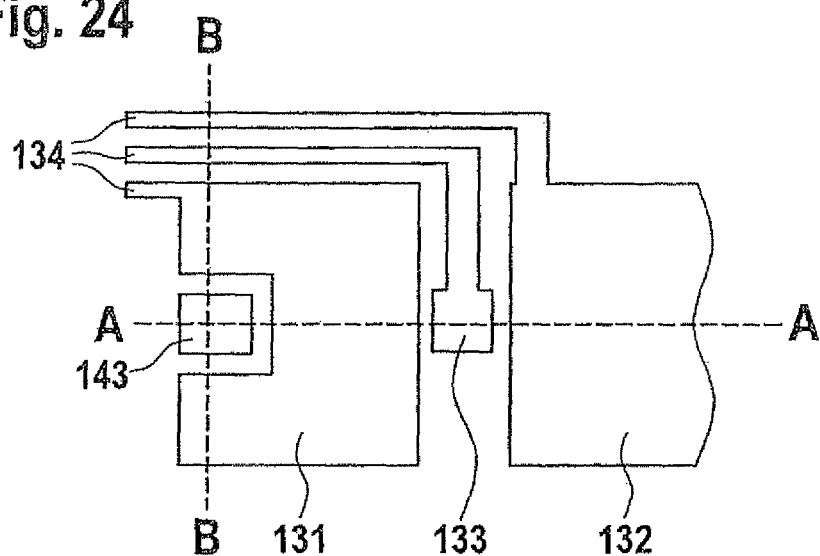
Figure 25:
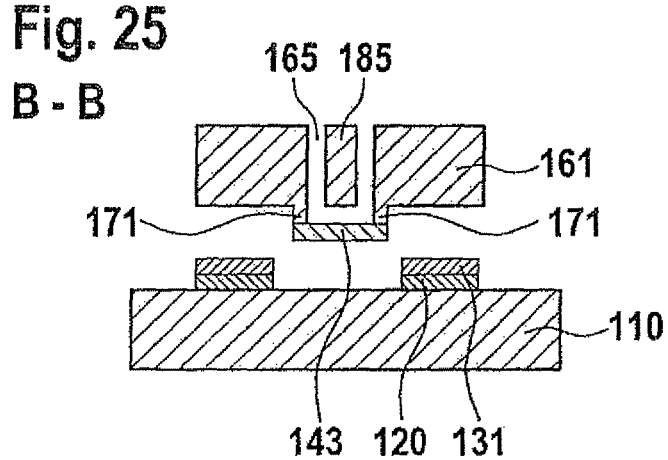

FIGS. 22 through 25 show a further functional substrate 101, whose rocker structure 160 has a through opening 165 on or adjoining the edge of each lever arm 161, 162, as shown in FIGS. 23 through 25. Furthermore, two protruding ridges 171, which are situated diametrically opposite each other, and on which a plate-shaped counter-structure 143 is situated, are provided on the bottom side of rocker structure 160 in the area of an opening 165. The lateral position of counter-structure 143, which is provided on lever arm 161, in relation to electrode 131 is clear on the basis of the top view of FIG. 24. In this case, electrode 131 (comparable to the configuration of FIG. 3) has a corresponding lateral formation or opening, in order to avoid contact between counter-structure 143 and electrode 131, which would impair a capacitance measurement, in the event of a rotation of rocker structure 160. Counter-structure 143 is located, however, as is shown in FIG. 22, in a different layer plane than electrodes 131, 132 or conductive layer 130.

A stop structure 180 is provided in each case on both sides of rocker structure 160, whose limiting section 182 has a ribbed subarea 185, which protrudes into an area enclosed by opening 165, as shown in FIG. 23. In this manner, subarea 185 of limiting section 182 is enclosed in a U-shape by rocker structure 160, ridges 171, and counter-structure 143, which is fastened on ridges 171, as shown in FIG. 25. Such a structure also allows a relatively space-saving configuration and a high stability during stopping, because counter-structure 143 is generally subjected to a tensile stress upon contact with subarea 185 of limiting section 182.

Functional substrate 101 of FIGS. 22 through 25 may be manufactured by performing steps corresponding to the example method which is explained on the basis of FIGS. 8 through 13. In this case, the illustrated shape of rocker structure 160 having opening 165 on each side is produced by structuring a previously applied functional layer 150. This also applies to stop structure 180. To manufacture the connection between ridges 171 and associated counter-structure 143, a (second) sacrificial layer, which is applied after the implementation of counter-structure 143, is partially removed before the application of functional layer 150, whereby counter-structure 143 is partially exposed. This sacrificial layer is further used for the purpose of precisely fixing a distance between counter-structure 143 and an associated limiting section 182 or its subarea 185.

Instead of functional substrate 101, which is shown in FIGS. 22 through 25, one functional substrate having a different number of openings 165 and engaging subareas 185 may also be implemented on each "rocker side." In addition, a plate-shaped counter-structure 143, which is fastened on the bottom side of a rocker structure 160 on ridges 171, may also be implemented in the same layer plane as electrodes 131, 132 or originate from the same conductive layer 130. An embodiment of this type may be manufactured by performing method steps corresponding to the example method explained on the basis of FIGS. 4 through 7.

FIGS. 26 through 29 show a further functional substrate 101, whose rocker structure 160 again has a through opening 165 at the edge of each lever arm 161, 162, as shown in FIGS. 27 and 29. Two protruding ridges or connection elements 172, which are situated diametrically opposite each other, are provided for fastening a counter-structure 144 on the bottom side of rocker structure 160 in the area of an opening 165. As shown in FIG. 28, counter-structure 144 is generally U-shaped having two legs, and is only connected to connection elements 172 of rocker structure 160 in the area of the leg ends. In this manner, an elastic structure is provided, whereby "soft" or "decelerated" stopping is made possible. In this manner (corresponding to above-described elastic sections 163, 183), the risk of damage during stopping may be avoided.

Furthermore, the lateral position of counter-structure 144, which is provided on lever arm 161, in relation to electrode 131 is clear on the basis of the top view of FIG. 28. In this case, electrode 131 (comparable to the configuration of FIG. 3) has a corresponding lateral formation or opening, in order to avoid contact between counter-structure 144 and electrode 131, which would impair a capacitance measurement, in the event of a rotation of rocker structure 160. However, as is shown in FIG. 29, counter-structure 144 is located in a different layer plane than electrodes 131, 132 or conductive layer 130.

A stop structure 180 is provided in each case on both sides of rocker structure 160, whose limiting section 182 has a ribbed subarea 185, which protrudes into an area enclosed by opening 165, as shown in FIG. 27. Elastic counter-structure 144 is situated below subarea 185, as shown in FIG. 29. Because of the U shape of counter-structure 144, ribbed subarea 185 of limiting section 182 is only touched by the section of counter-structure 144 at which the legs run together ("base") during stopping, while in contrast the legs may be moved past subarea 185.

Functional substrate 101 of FIGS. 26 through 29 may be manufactured by performing steps similar to the example method which is explained on the basis of FIGS. 8 through 13. Rocker structure 160 having opening 165 on each side is produced by structuring a previously applied functional layer 150. This also applies to stop structure 180. To manufacture connection elements 172, a (second) sacrificial layer, which is applied after the implementation of U-shaped counter-structure 144, is partially removed before the application of functional layer 150, whereby counter-structure 144 is partially exposed. This sacrificial layer is further used for the purpose of fixing a distance between counter-structure 144 and limiting section 182 or its subarea 185.

Instead of functional substrate 101 shown in FIGS. 26 through 29, one functional substrate having a different number of openings 165 and engaging subareas 185 may also be implemented on each "rocker side." Furthermore, an elastic counter-structure 144, which is fastened to the bottom side of a rocker structure 160 on connection elements 172, may also be implemented in the same layer plane as electrodes 131, 132 or originate from the same conductive layer 130. A specific embodiment of this type may be manufactured by performing method steps similar to the method explained on the basis of FIGS. 4 through 7. In addition, an elastic counter-structure having a different shape than the illustrated U shape may also be manufactured.

Figure 32:
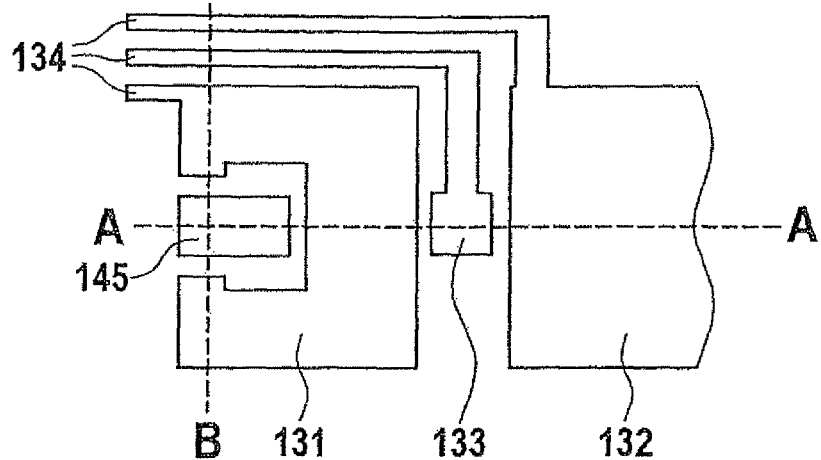
Figure 33:
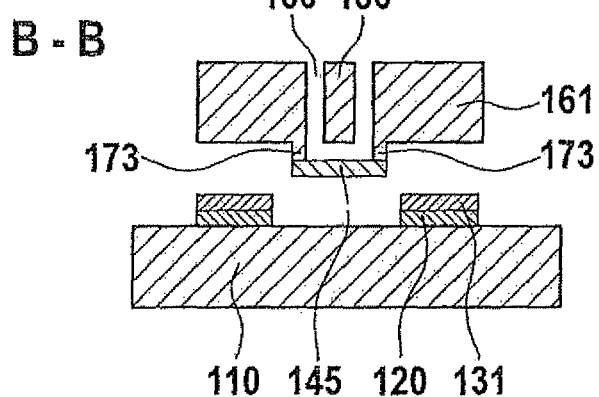

FIGS. 30 through 33 show a further embodiment of a functional substrate 101, whose rocker structure 160 again has a through opening 166 at the edge of each lever arm 161, 162, as shown in FIGS. 31 and 33. Opening 166 is T-shaped in the top view (in contrast to rectangular opening 165 of FIGS. 23 and 27). In addition, opening 166 has nubby protrusions 179 on the inside.

Protruding ridges 173, on which a plate-shaped counter-structure 145 is situated, are provided on the bottom side of rocker structure 160 in the area of an opening 166. The lateral position of counter-structure 145, which is provided on lever arm 161, in relation to electrode 131 is shown in the top view of FIG. 32. In this case, electrode 131 has a lateral formation or opening, in order to avoid contact between counter-structure 145 and electrode 131, which would impair a capacitance measurement, in the event of a rotation of rocker structure 160. The opening of electrode 131 may be implemented as T-shaped, similar to opening 166 of lever arm 161 which is situated above it, as indicated in FIG. 32. Counter-structure 144 is located in a different layer plane than electrodes 131, 132 or conductive layer 130, as is obvious on the basis of FIG. 30.

A stop structure 180 is provided in each case on both sides of rocker structure 160, whose limiting section 182 has a T-shaped subarea 186, which protrudes into an area enclosed by T-shaped opening 166 or is enclosed by T-shaped opening 166, as shown in FIG. 31. Through the corresponding T shape of opening 166 and subarea 186 and nubby protrusions 179, the possibility is provided of additionally also reliably and precisely limiting lateral deflections of rocker structure 160.

Functional substrate 101 of FIGS. 30 through 33 may be manufactured by performing steps similar to the example method explained on the basis of FIGS. 8 through 13. In this case, the illustrated shape of rocker structure 160 having opening 166 on each side is produced by structuring a previously applied functional layer 150. This also applies to stop structure 180 having subarea 186. To manufacture the connection between ridges 173 and associated counter-structure 145, a (second) sacrificial layer, which is applied after the implementation of counter-structure 145, is partially removed before the application of functional layer 150, whereby counter-structure 145 is partially exposed. This sacrificial layer is further used for the purpose of fixing a distance between counter-structure 145 and associated subarea 185 of limiting section 182.

Instead of functional substrate 101 which is shown in FIGS. 30 through 33, one functional substrate having a different number of T-shaped openings 166 and engaging subareas 186 may also be implemented on each "rocker side." In addition, a plate-shaped counter-structure 145, which is fastened on the bottom side of a rocker structure 160 on ridges 173, may also be implemented in the same layer plane as electrodes 131, 132 or originate from the same conductive layer 130. A specific embodiment of this type may be manufactured by performing method steps corresponding to the method which is explained on the basis of FIGS. 4 through 7.

Figure 34:
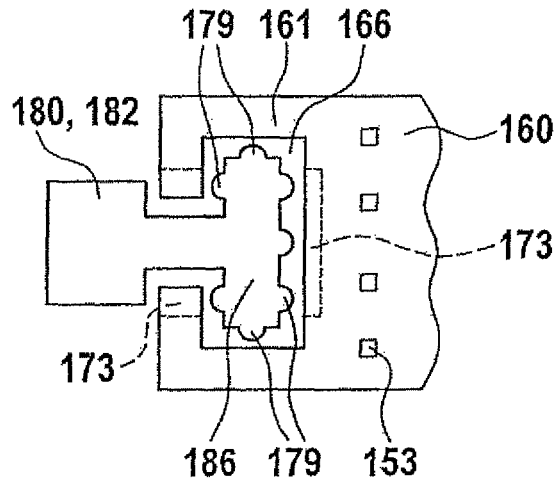
FIG. 34 shows a schematic top view of an alternative design of the functional substrate of FIGS. 30 through 33.
Figure 35:
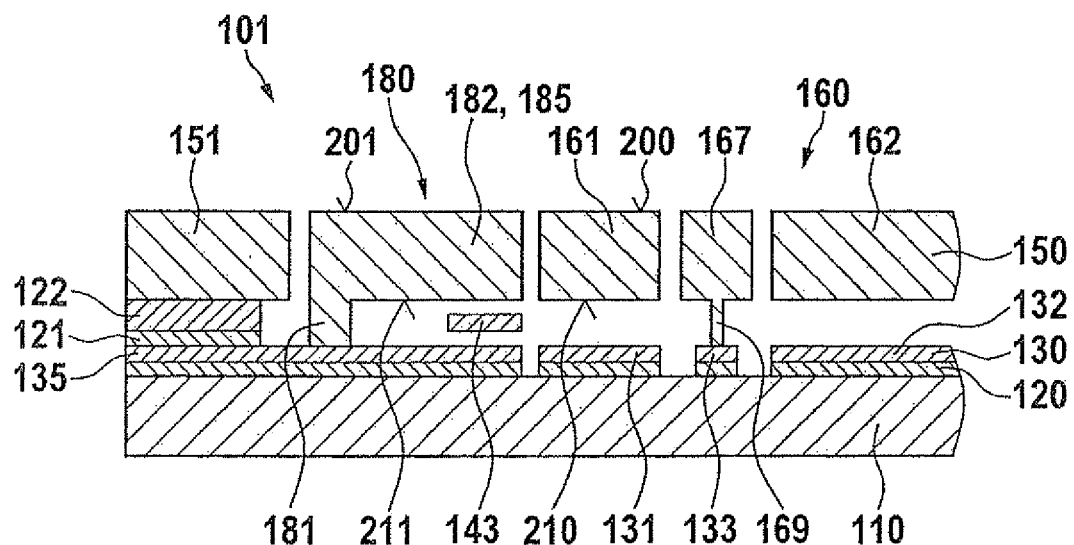
FIGS. 35 and 36 show schematic sectional views of a further functional substrate.
Figure 36:
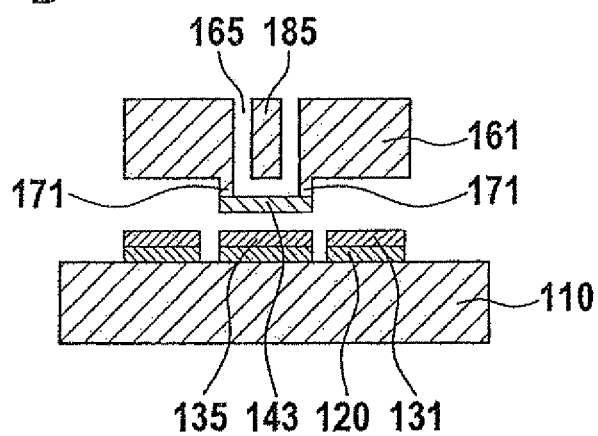

An alternative embodiment to functional substrate 101 shown in FIGS. 30 through 33 is illustrated in the top view of FIG. 34. In this case, rocker structure 166 again has a through T-shaped opening 166 at the edge, within which a T-shaped subarea 186 of a limiting section 182 of a stop structure 180 is situated. In contrast to the specific embodiment shown in FIG. 31, nubby protrusions 179 are provided for delimiting a lateral movement of rocker structure 160 on subarea 186. A combination of the configurations shown in FIGS. 31 and 34 is also possible, so that nubby protrusions 179 are provided both on a limiting section or its T-shaped subarea and also on the inside of a through opening of a rocker structure (not shown).

In the specific example embodiments shown on the basis of FIGS. 18 through 34, only the surface of substrate 110 is located below particular counter-structures 142, 143, 144, 145. However, the specific embodiments may also be modified in such a manner that an additional layer is provided below counter-structures 142, 143, 144, 145, with the aid of which defined stopping of particular counter-structure 142, 143, 144, 145 is made possible in the event of a deflection of rocker structure 160 or a lever arm 161, 162 in the direction of substrate 110. A variant of this type is illustrated on the basis of the sectional views of FIGS. 35 and 36 with respect to the functional substrate shown in FIGS. 22 through 25. In this case, a subarea 135 of conductive layer 130 is provided below counter-structure 143—comparable to the configuration shown in FIG. 13.

Figure 45:
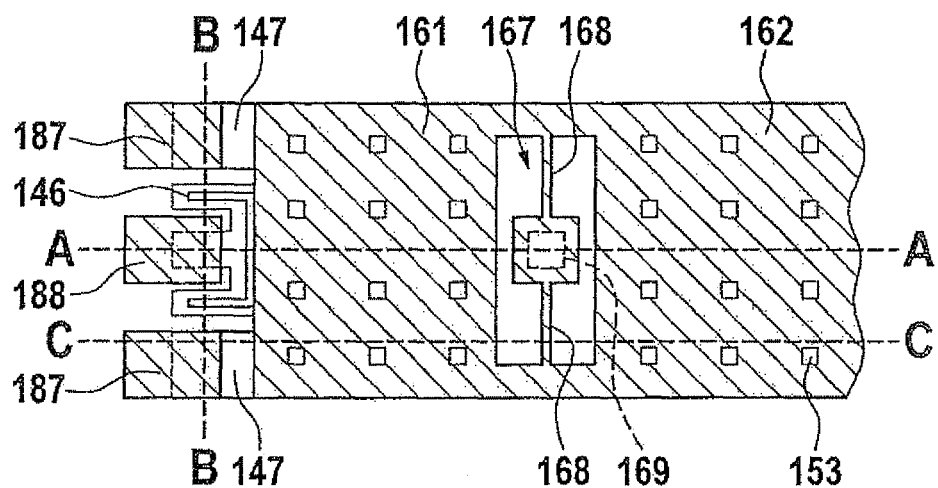
FIGS. 45 and 46 show further schematic views of the functional substrate which is manufactured according to FIGS. 36 through 43.
Figure 46:
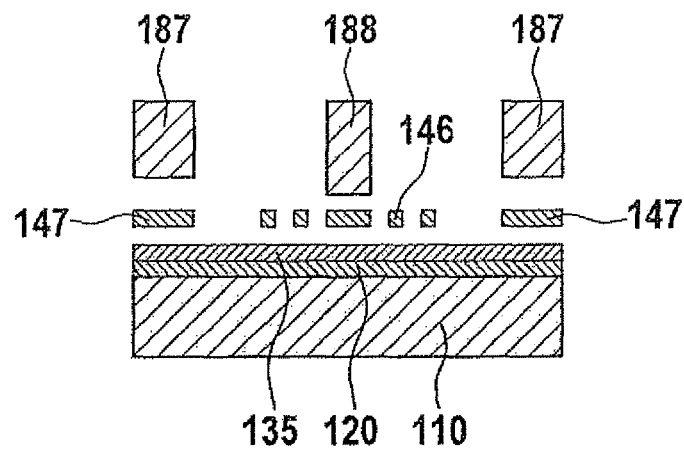

A further possible alternative is the implementation of structures which allow "staggered" stopping. This means that in a deflection of a rocker structure 160, first "soft" stopping occurs, and "hard" stopping occurs in a further deflection of rocker structure 160. In this regard, FIGS. 37 through 44 show—each in a lateral sectional view along a section line A-A (middle) and a section line C-C (edge)—a further method for manufacturing a functional substrate 101. An associated top view of a rocker structure 160 and a limiting section 182 of a stop structure 180 of functional, substrate 101 including section line A-A and C-C is shown in FIG. 45, and a further sectional view (along a section line B-B) is shown in FIG. 46.

In this method, as shown in FIGS. 37 and 38, a substrate 110 is provided, an insulating layer 120 is applied to substrate 110, and a conductive layer 130 is applied to the insulating layer. Conductive layer 130 is also structured in order to implement two electrodes 131, 132, printed conductors (not shown), and subareas 133, 135. A first sacrificial layer 121 is subsequently applied to layers 120, 130 and structured, in order to expose conductive layer 130 at predefined areas.

Subsequently thereto, a further conductive layer is implemented on sacrificial layer 121 and structured, in order to implement an elastic counter-structure 146 (FIG. 37) in the middle (on each side of later rocker structure 160 in each case) and a plate-shaped counter-structure 147 (FIG. 38) on each of the edges. Furthermore, as shown in FIG. 38, a further sacrificial layer 123, which covers counter-structures 147, is only implemented at the edges, which is performed by applying and subsequently structuring sacrificial layer 123. Subsequently thereto, a further sacrificial layer 122 is implemented and a structuring process is performed, in order to expose counter-structures 146, 147 and subareas 133, 135 at predefined locations, as shown in FIGS. 39 and 40.

Subsequently, as shown in FIGS. 41 and 42, a functional layer 150 is applied to sacrificial layer 122 and to the uncovered areas of counter-structures 146, 147 and conductive layer 130. Furthermore, functional layer 150 is structured in order to implement a rocker structure 160 having lever arms 161, 162, a carrier structure 167, a stop structure 180 (on the side of lever arms 161, 162 in each case), and a section 151 and a contact element 152. A stop structure 180 includes a limiting section 188 (FIG. 41), which is situated above elastic counter-structure 146, in the middle in this case, and limiting sections 187 situated at the edges above counter-structures 147 (FIG. 42). Furthermore, support elements 169, 181 of carrier structure 167 and stop structure 180 and connection elements 174 (on each lever arm 161, 162), which are connected to counter-structures 146, 147, are produced by the application of functional layer 150 at the previously exposed positions of counter-structures 146, 147 and conductive layer 130. Subsequently, an etching medium or etching gas is conducted through structured functional layer 150 to sacrificial layers 121, 122, 123 and to insulating layer 120, whereby affected layers 120, 121, 122, 123 are (partially) removed, and as a result functional substrate 101, which is shown in FIGS. 43 and 44, is generally finished.

In the method shown in FIGS. 37 through 44, the distance to the edges between limiting sections 187 of stop structure 180 and counter-structures 147 is set via sacrificial layers 122, 123, and the distance in the middle between limiting section 188 and elastic counter-structure 146 is set via sacrificial layer 122. Due to additional sacrificial layer 123, which is used at the edges, limiting sections 187 therefore have a greater distance to counter-structures 147 than limiting section 188 has to counter-structure 146. Through this design, in the event of a deflection of a lever arm 161, 162 of rocker structure 160 in a direction away from substrate 110, elastic counter-structure 146 initially comes into contact with a limiting section 188, and counter-structures 147 only stop "hard" on limiting sections 187 in the event of a further deflection of affected lever arm 161 away from substrate 110.

In this example embodiment, limiting sections 187, 188 of a stop structure 180 are also (generally) in a plane with rocker structure 160. Bottom side 211 of a limiting section 187 provided in the middle is not directly in a plane with bottom side 210 of rocker structure 160 (compare FIG. 44) in this case because of the use of additional sacrificial layer 123. However, this property is essentially fulfilled upon use of a relatively "flat" sacrificial layer 123 (layer thickness in a range of 1 µm, for example) in comparison to functional layer 150 (layer thickness in a range of 10 µm to 20 µm, for example).

Furthermore, an exemplary embodiment of elastic counter-structure 146, which is situated in the middle, is clear on the basis of the top view of FIG. 45. Illustrated counter-structure 146 has a plate-shaped section below associated limiting section 188 of stop structure 180, and two U-shaped sections laterally from the plate-shaped section, which are connected at their outer legs (i.e., diametrically opposite to a counter-structure 147) to rocker structure 160 (via a connection element 174). In the event of stopping, only the plate-shaped section of counter-structure 146 touches limiting section 188, while in contrast the U-shaped sections may be moved past limiting section 188.

"Staggered" stopping may also be implemented with the aid of stop structures and counter-structures which have a different embodiment and shape than stop and counter-structures 146, 147, 187, 188. A further possible embodiment is, for example, to provide elastic counter-structures at the edge of a rocker structure, and a counter-structure for "hard" stopping in the middle of the rocker structure, "reversed" from functional substrate 101, which is described on the basis of FIGS. 37 through 46.

Figure 47:
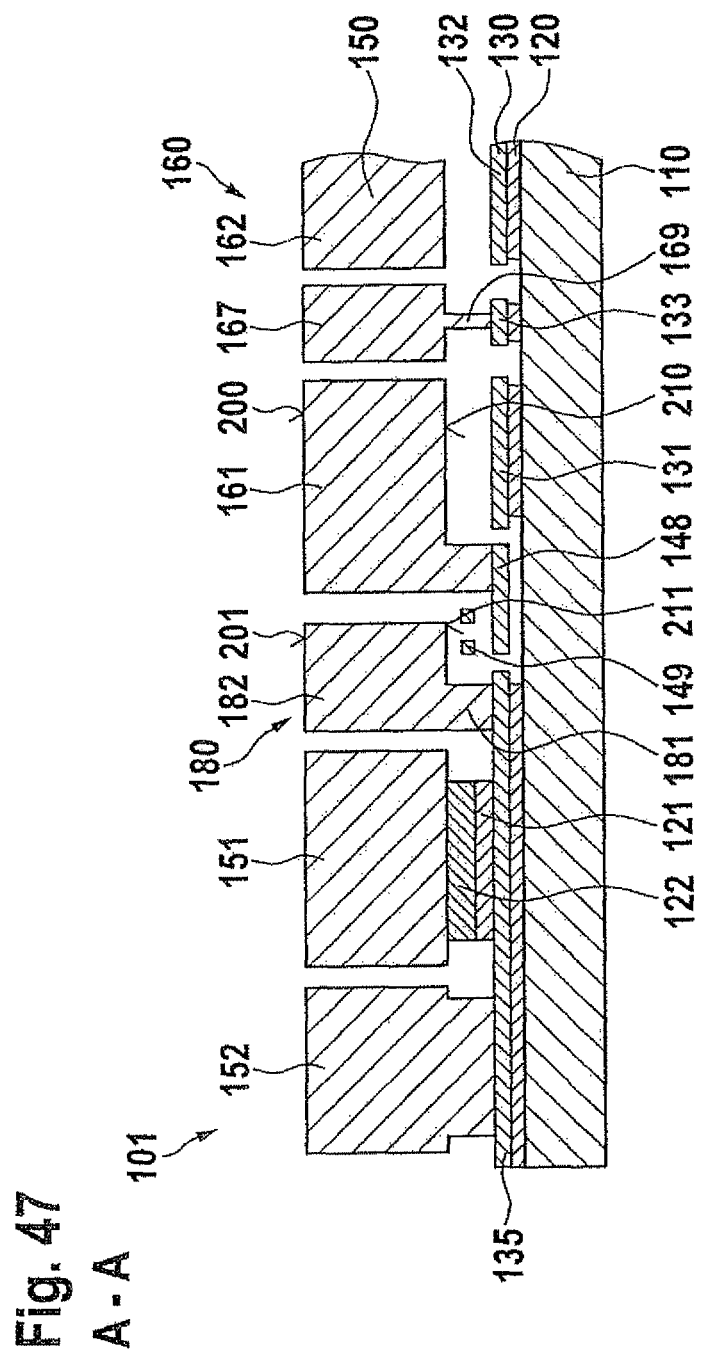
FIGS. 47 through 49 show a further functional substrate in various schematic sectional and top views.
Figure 48:
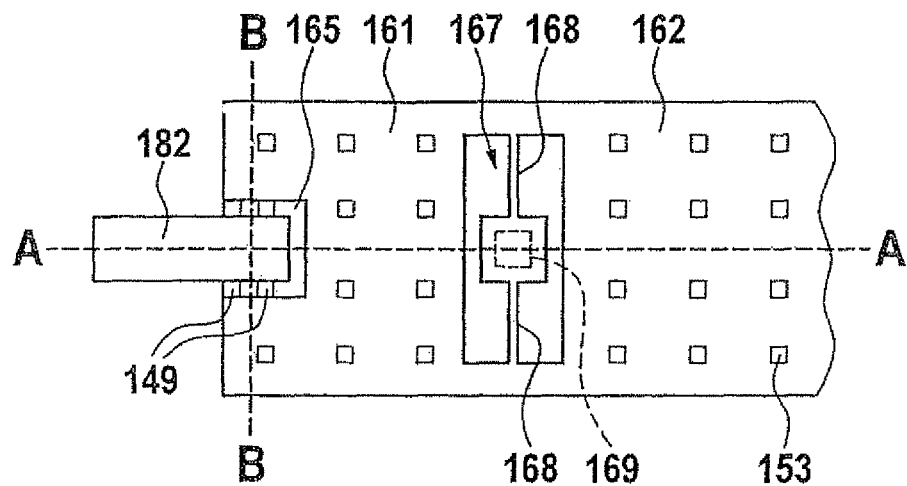
Figure 49:
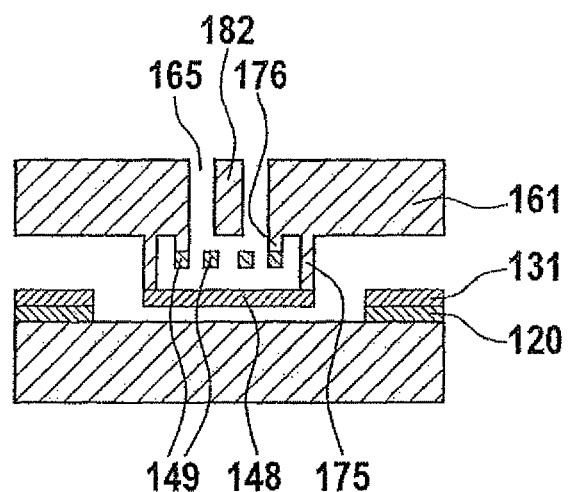

FIGS. 47 through 49 show a further functional substrate 101 in various schematic sectional views along section line A-A and B-B and in a top view, in which "staggered" stopping is made possible. Rocker structure 160 has a through opening 165 at the edge of each lever arm 161, 162 in this case. Diametrically opposing ridges 175, 176, which have different heights, are provided on the bottom side of rocker structure 160 in the area of an opening 165, as shown in FIG. 49. A plate-shaped counter-structure 148 is situated on the larger ridges 175, which are situated further outward, and an elastic counter-structure 149 is situated on smaller ridges 176, which are situated further inward, so that elastic counter-structure 149 is provided above counter-structure 148.

A stop structure 180 is provided in each case on both sides of rocker structure 160, whose limiting section 182 protrudes into an area enclosed by opening 165. In the event of a deflection of a lever arm 161, 162 in a direction away from substrate 110, elastic counter-structure 149 first comes into contact with limiting section 182. "Hard" stopping on limiting section 182 only occurs in the event of a further deflection of affected lever arm 161, 162 away from substrate 110, counter-structure 148 pressing against counter-structure 149 in this case.

To manufacture such a functional substrate 101 having two counter-structures 148, 149 situated one above the other, method steps may be performed that are similar to the method explained on the basis of FIGS. 8 through 13, the shape and position of lower counter-structure 148 additionally being fixed during the structuring of conductive layer 130. By using sacrificial layers 121, 122, the distance between counter-structures 148, 149, and the distance between upper counter-structure 149 and limiting section 182 may be fixed. In this case, employed sacrificial layers 121, 122 are further structured in order to fix the shape of ridges 175, 176, which are connected to counter-structures 148, 149, and which again originate from functional layer 150. Instead of functional substrate 101 shown in FIGS. 47 through 49, one functional substrate 101 having a different number of openings 165 (including counter-structures 148, 149 situated one over the other) and engaging limiting sections 182 may also be implemented on each "rocker side."

The components or functional substrates 101 explained on the basis of the figures and the various methods represent preferred and/or exemplary specific embodiments of the present invention. In addition to the described and illustrated specific embodiments, further specific embodiments are possible, which may include further modifications or combinations of features. Furthermore, it is additionally to be noted that the listed materials are only to be viewed as examples, which may optionally be replaced by other materials.

The described features are also not restricted to components or their functional substrates, in which a seismic mass in the form of a rocker structure is implemented, but rather may also be used with respect to specific embodiments having different seismic masses (which are deflectable perpendicular or parallel to the substrate plane) suspended on a substrate via spring elements. A stop structure, which is separate from the seismic mass and is provided on the same substrate, having a limiting section may also be implemented in designs of this type, the limiting section (generally) being in a plane with the seismic mass, in order to allow defined stopping of the seismic mass. In this case, the seismic mass and the associated stop structure may also be implemented from a shared functional layer on the substrate, and a sacrificial layer technique may also be performed to set a predefined distance.

What is claimed is:

1. A micromechanical component, comprising:
a substrate;
a seismic mass which is deflectably situated on the substrate;
a stop structure to limit a deflection of the seismic mass in a direction away from the substrate, wherein the stop structure is situated on the substrate and has a limiting section in a plane with the seismic mass to limit the deflection of the seismic mass; and
a counter-structure situated on the seismic mass, and which comes into contact with the limiting section of the stop structure in an event of deflection of the seismic mass in a direction away from the substrate.

2. The micromechanical component as recited in claim 1, wherein the seismic mass has a connection element which is connected to the counter-structure on a bottom side at an edge area, and the counter-structure protrudes laterally beyond the edge area of the seismic mass.

3. The micromechanical component as recited in claim 1, wherein the seismic mass has a first and a second rib which run perpendicularly to the substrate, at an edge area, the counter-structure is situated on the bottom sides of the first and second ribs, and the limiting section of the stop structure has a third rib which runs perpendicularly to the substrate and which protrudes into an area between the first and second ribs of the seismic mass.

4. The micromechanical component as recited in claim 1, wherein the seismic mass has a through opening adjoining an edge area and protruding ridges on a bottom side in an area of the opening, on which the counter-structure is situates, and the limiting section of the stop structure protrudes into an area enclosed by the opening.

5. The micromechanical component as recited in claim 4, wherein at least one of the limiting section of the stop structure and the seismic mass have protruding structural elements in the area of the opening for limiting a lateral deflection of the seismic mass.

6. The micromechanical component as recited in claim 1, wherein the counter-structure, which is situated on the seismic mass, has at least one of a plate-shaped structure and an elastic structure.

7. A micromechanical component, comprising:
a substrate;
a seismic mass which is deflectably situated on the substrate; and
a stop structure to limit a deflection of the seismic mass in a direction upward and away from the substrate, wherein the stop structure is situated on the substrate and has a limiting section in a plane with the seismic mass to limit the deflection of the seismic mass.

8. The micromechanical component as recited in claim 7, wherein one of a section of the seismic mass or a section of the stop structure is implemented in the form of an elastic structure.

9. The micromechanical component as recited in claim 7, wherein the stop structure is situated on a conductive layer of the substrate.

10. The micromechanical component as recited in claim 7, wherein the stop structure has a support element, which is connected to the limiting section.

11. The micromechanical component as recited in claim 7, further comprising:
a layer situated on the substrate in an area below the limiting section of the stop structure, the layer for limiting a deflection of the seismic mass in a direction toward the substrate.

12. The micromechanical component as recited in claim 7, wherein the seismic mass is implemented in a form of a rocker structure, which is deflectable situated on the substrate via a carrier structure having a torsion spring.

13. The micromechanical component as recited in claim 7, wherein the seismic mass includes a first lever arm and a second lever arm having different lengths.

\* \* \* \* \*